(12) United States Patent
Zhang

(10) Patent No.: US 12,010,834 B2
(45) Date of Patent: Jun. 11, 2024

(54) THREE-DIMENSIONAL MEMORY DEVICES WITH STABILIZATION STRUCTURES BETWEEN MEMORY BLOCKS AND METHODS FOR FORMING THE SAME

(71) Applicant: YANGTZE MEMORY TECHNOLOGIES CO., LTD., Wuhan (CN)

(72) Inventor: Kun Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 797 days.

(21) Appl. No.: 17/084,297

(22) Filed: Oct. 29, 2020

(65) Prior Publication Data

US 2022/0052062 A1 Feb. 17, 2022

Related U.S. Application Data

(63) Continuation of application No. PCT/CN2020/109548, filed on Aug. 17, 2020.

(51) Int. Cl.
*H10B 41/27* (2023.01)
*H10B 41/10* (2023.01)
(Continued)

(52) U.S. Cl.
CPC ............ *H10B 41/27* (2023.02); *H10B 41/10* (2023.02); *H10B 41/35* (2023.02); *H10B 41/40* (2023.02);
(Continued)

(58) Field of Classification Search
CPC ........ H10B 43/27; H10B 43/50; H10B 41/10; H10B 41/27; H10B 41/35; H10B 41/50; H10B 43/10; H10B 43/35; H10B 43/40
See application file for complete search history.

(56) References Cited

U.S. PATENT DOCUMENTS

2017/0141121 A1 5/2017 Freeman et al.
2019/0043883 A1* 2/2019 Xu ...................... H01L 23/5226
(Continued)

FOREIGN PATENT DOCUMENTS

CN 106920796 A 7/2017
CN 109314116 A 2/2019
(Continued)

OTHER PUBLICATIONS

International Search Report issued in corresponding International Application No. PCT/CN2020/109548, dated May 14, 2021, 4 pages.

*Primary Examiner* — Alia Sabur
(74) *Attorney, Agent, or Firm* — BAYES PLLC

(57) ABSTRACT

Embodiments of 3D memory devices and methods for forming the same are disclosed. In an example, a 3D memory device includes a plurality of memory blocks in a plan view and at least one stabilization structure extending laterally to separate adjacent ones of the memory blocks in the plan view. Each of the memory blocks includes a memory stack including vertically interleaved conductive layers and first dielectric layers, and a plurality of channel structures each extending vertically through the memory stack. The stabilization structure includes a dielectric stack including vertically interleaved second dielectric layers and the first dielectric layers.

20 Claims, 12 Drawing Sheets

(51) Int. Cl.
*H10B 41/35* (2023.01)
*H10B 41/40* (2023.01)
*H10B 43/10* (2023.01)
*H10B 43/27* (2023.01)
*H10B 43/35* (2023.01)
*H10B 43/40* (2023.01)

(52) U.S. Cl.
CPC ............ *H10B 43/10* (2023.02); *H10B 43/27* (2023.02); *H10B 43/35* (2023.02); *H10B 43/40* (2023.02)

(56) References Cited

U.S. PATENT DOCUMENTS

| | | | |
|---|---|---|---|
| 2019/0067314 | A1 | 2/2019 | Lu et al. |
| 2020/0066742 | A1* | 2/2020 | Kim ..................... H10B 43/27 |
| 2021/0358935 | A1* | 11/2021 | Jung ................. G11C 16/0483 |

FOREIGN PATENT DOCUMENTS

| | | | |
|---|---|---|---|
| CN | 109314118 | A | 2/2019 |
| CN | 109844931 | A | 6/2019 |
| CN | 109906511 | A | 6/2019 |
| CN | 110114879 | A | 8/2019 |
| CN | 110121778 | A | 8/2019 |
| CN | 110168728 | A | 8/2019 |
| CN | 110718241 | A | 1/2020 |
| CN | 110800108 | A | 2/2020 |
| CN | 110896669 | A | 3/2020 |
| CN | 110914990 | A | 3/2020 |
| CN | 110914991 | A | 3/2020 |
| TW | 201442236 | A | 11/2014 |

\* cited by examiner

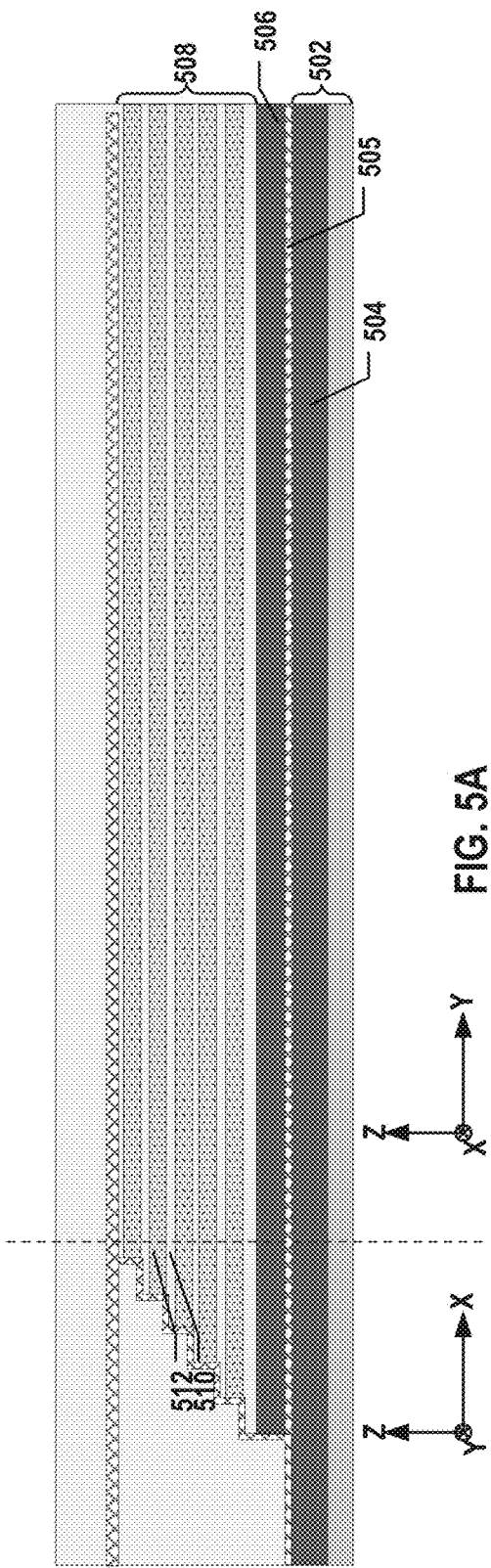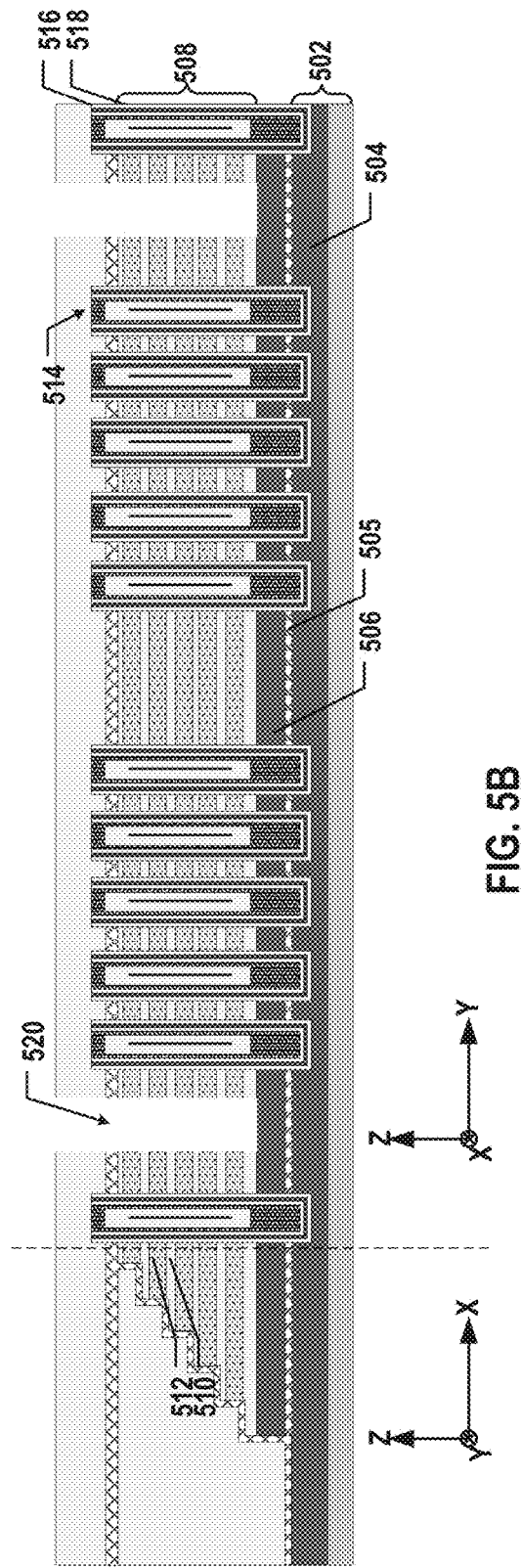

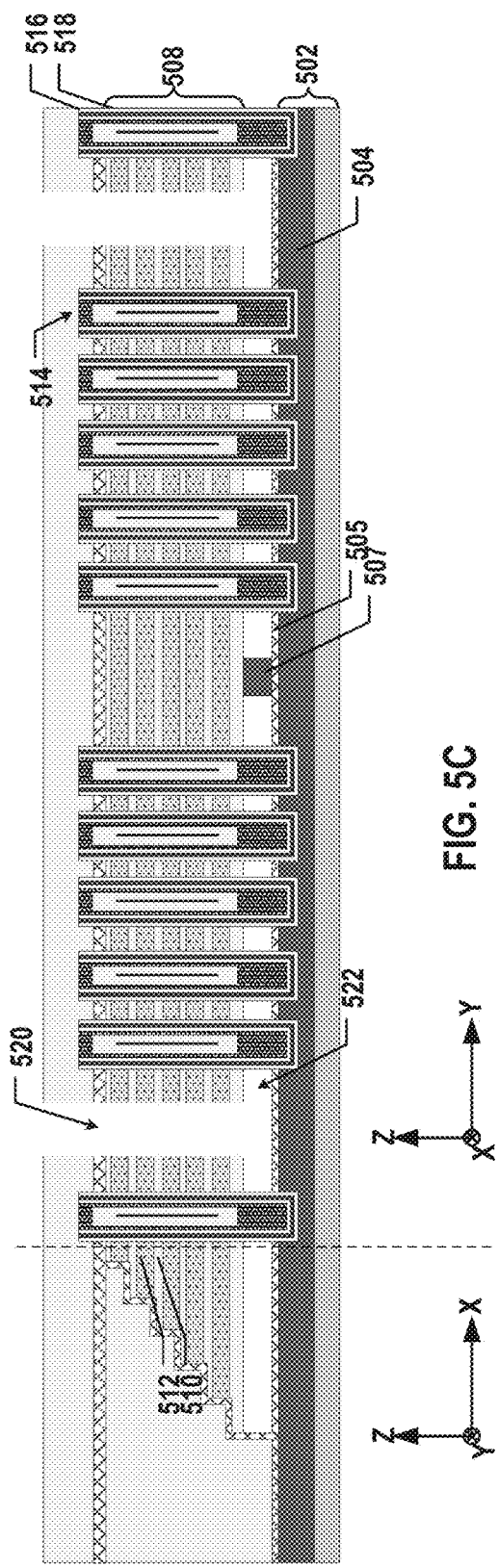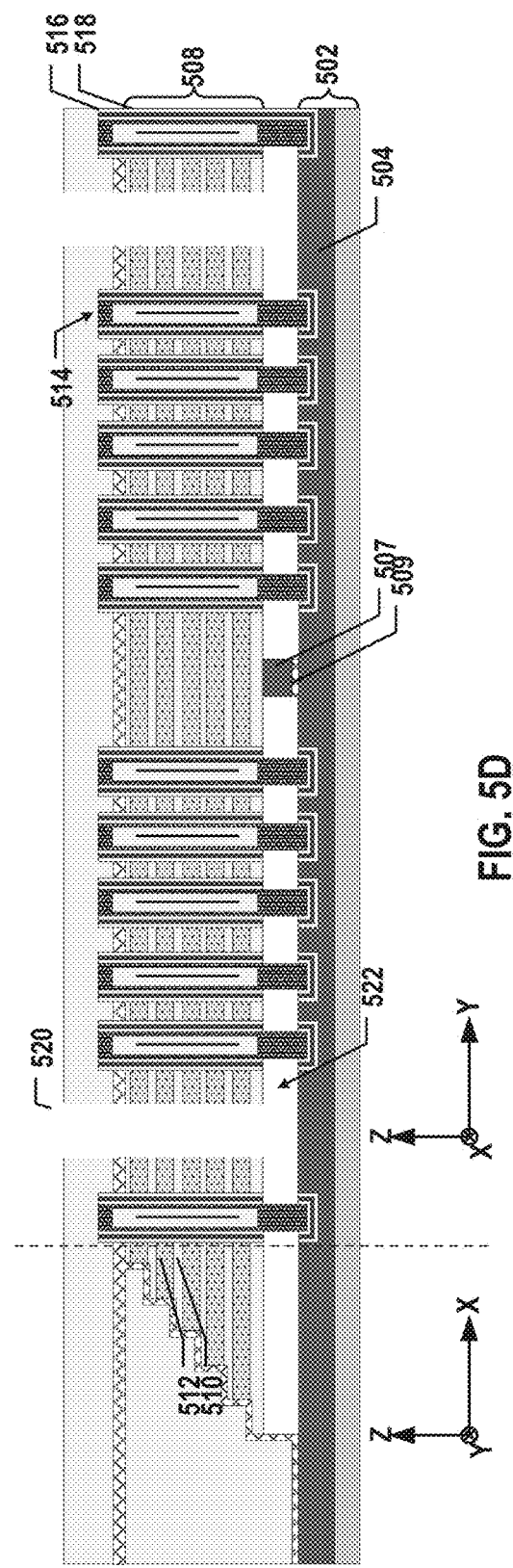

THREE-DIMENSIONAL MEMORY DEVICES WITH STABILIZATION STRUCTURES BETWEEN MEMORY BLOCKS AND METHODS FOR FORMING THE SAME

CROSS-REFERENCE TO RELATED APPLICATIONS

This application is continuation of International Application No. PCT/CN2020/109548, filed on Aug. 17, 2020, entitled "THREE-DIMENSIONAL MEMORY DEVICES WITH STABILIZATION STRUCTURES BETWEEN MEMORY BLOCKS AND METHODS FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a plurality of memory blocks in a plan view and at least one stabilization structure extending laterally to separate adjacent ones of the memory blocks in the plan view. Each of the memory blocks includes a memory stack including vertically interleaved conductive layers and first dielectric layers, and a plurality of channel structures each extending vertically through the memory stack. The stabilization structure includes a dielectric stack including vertically interleaved second dielectric layers and the first dielectric layers.

In another example, a 3D memory device includes a plurality of memory blocks arranged in a first lateral direction in a plan view, and at least one stabilization structure each between adjacent ones of the memory blocks in the first lateral direction. Each of the memory blocks includes a plurality of memory fingers arranged in the first lateral direction and at least one slit structure having an "H" cut each between adjacent ones of the memory fingers in the first lateral direction. Each of the memory fingers includes an array of channel structures. The stabilization structure includes a dielectric stack including vertically interleaved first dielectric layers and second dielectric layers.

In still another example, a method for forming a 3D memory device is disclosed. A dielectric stack including vertically interleaved first dielectric layers and second dielectric layers is formed above a substrate. A plurality of channel structures each extending vertically through the dielectric stack are formed. At least one opening extending vertically through the dielectric stack is formed. Part of the dielectric stack is replaced, through the at least one opening, with a memory stack by replacing parts of the second dielectric layers with conductive layers to form a stabilization structure comprising a remainder of the dielectric stack.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 5A-5G illustrate a fabrication process for forming an exemplary 3D memory device with stabilization structures between memory blocks, according to some embodiments of the present disclosure.

Figure 1:
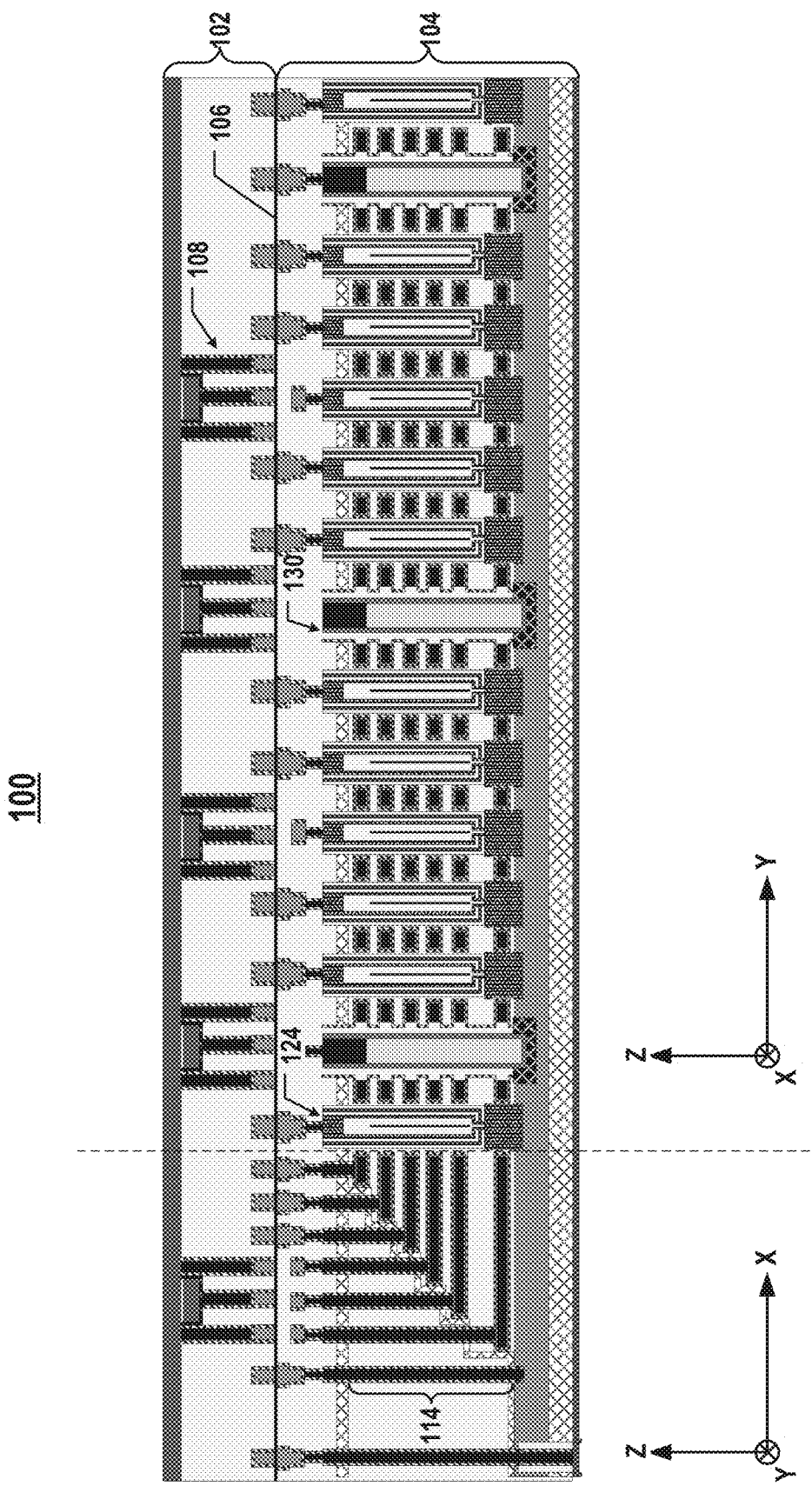
FIG. 1 illustrates a side view of a cross-section of a 3D memory device with slit structures between memory blocks.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (via) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In fabricating some 3D memory devices, more thin films (e.g., silicon oxide, silicon nitride, polysilicon, etc.) need to be deposited on the silicon substrate as the level of memory cells increases. For example, in 3D NAND memory devices, more thin films need to fill in the staircase area, core array area, and gate line slits, which may cause thin film deformation when the thin film structures become more complex, in particular, after thermal processes. The stress due to thin film deformation can further cause the deformation of the entire wafer (e.g., wafer bow or warp), thereby reducing the production yield. Also, slit structures (e.g., gate line slits (GLSs)) that extend laterally through the entire memory plane split the memory plane into separate parts, which may become structurally unstable as the levels of memory cells keep increasing.

For example, as shown in FIG. 1, a 3D memory device 100 includes a first semiconductor structure 102 and a second semiconductor structure 104 bonded at a bonding interface 106. First semiconductor structure 102 includes peripheral circuits 108 for sensing and controlling the operations of 3D memory device 100. Second semiconductor structure 104 includes a memory stack 114 and an array of channel structures 124 each extending vertically through memory stack 114. Memory stack 114 includes vertically interleaved conductive layers (functioning as gate electrodes/word lines) and dielectric layers (gate-to-gate dielectrics). Second semiconductor structure 104 also includes multiple slit structures (function as front side source contacts as array common source (ACS)) each extending vertically through memory stack 114 as well.

Figure 2:
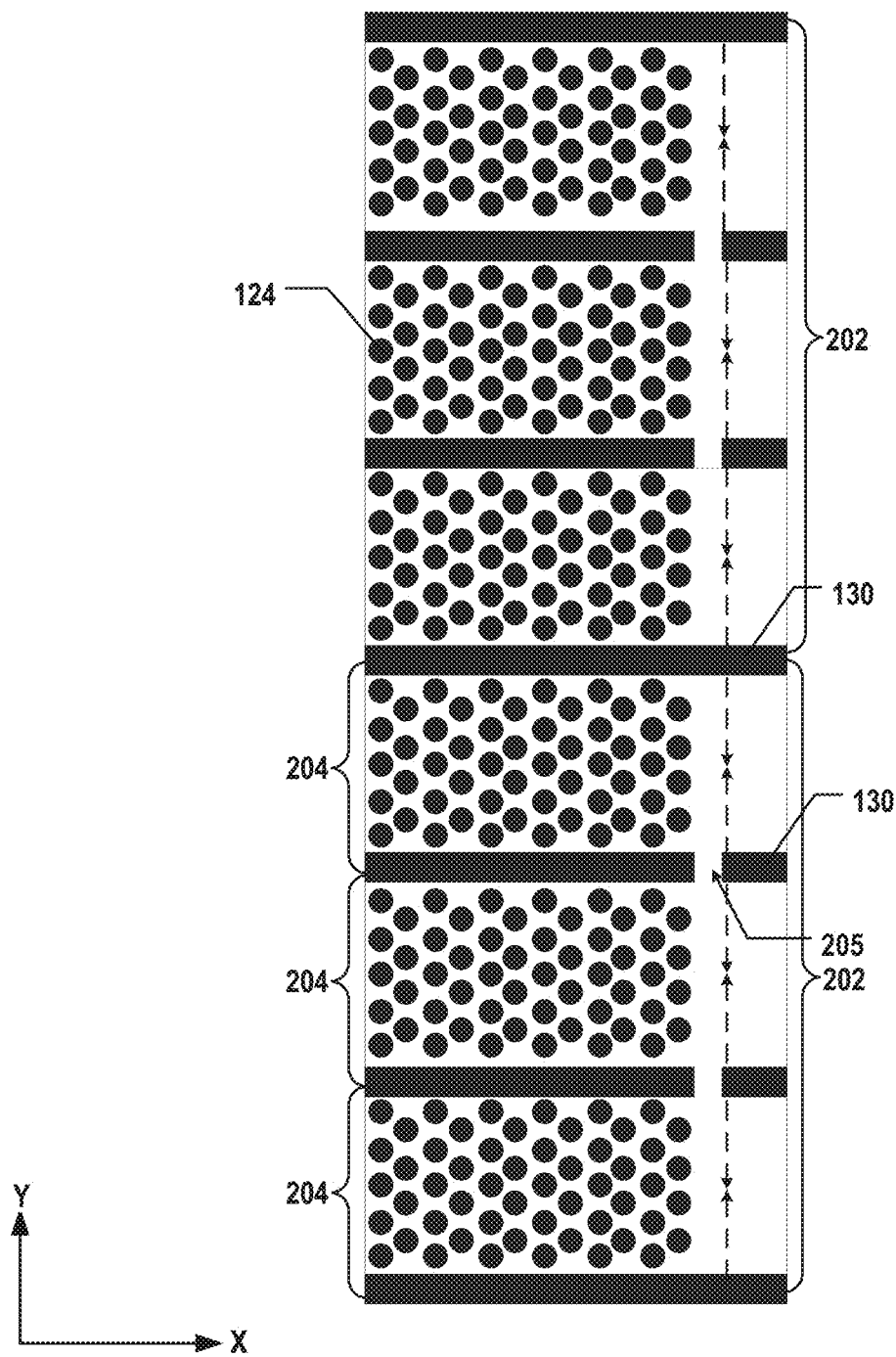
FIG. 2 illustrates a plan view of a cross-section of a 3D memory device with slit structures between memory blocks.

As shown in the plan view of FIG. 2, second semiconductor structure 104 of 3D memory device 100 includes a plurality of memory blocks 202 separated by slit structures 130. It is noted that x and y axes are included in FIG. 2 to illustrate two orthogonal directions in the wafer plane. The x-direction is the word line direction, and the y-direction is the bit line direction. Adjacent memory blocks 202 arranged in the y-direction (e.g., the bit line direction) are separated by a respective slit structure 130 extending laterally in the x-direction (e.g., the word line direction). In each memory block 202, slit structures 130 having "H" cuts 205 further separate memory block 202 into multiple memory fingers 204, each of which includes an array of channel structures 124. That is, slit structure 130 between memory blocks 202 is a continuous structure through the memory plane, which cuts off memory stack 114 between adjacent memory blocks 202, whereas slit structure 130 between memory fingers 204 within memory block 202 includes one or more "H" cuts 205 that connect memory stack 114 between adjacent memory fingers 204. Slit structures 130, in particular, the continuous structures between memory blocks 202, can introduce stress to 3D memory device 100 due to their filling materials, such as polysilicon and tungsten, in the slit openings. Also, the formation of each slit structure 130 involves the etching of a deep slit opening through a dielectric stack forming memory stack 114, and the slit opening also extends laterally through the entire memory plane of second semiconductor structure 104 in the word line direction. During the gate-replacement process, the slit openings serve as the inlets and passageways (indicated by the dashed arrows) for introducing the etchants to remove the sacrificial layers of the dielectric stack; the dielectric stack may become unstable due to the large number of long slit openings cutting through the dielectric stack.

Moreover, in some 3D NAND memory devices, semiconductor plugs are selectively formed to surround the sidewalls of channel structures, e.g., known as sidewall selective epitaxial growth (SEG). Sidewall semiconductor plugs are usually formed by replacing a sacrificial layer between the substrate and stack structure with the sidewall semiconductor plugs, which involves multiple deposition and etching processes through the slit openings. However, in fabricating the sidewall semiconductor plugs, once the sacrificial layer is fully removed through the slit openings, only channel structures and dummy channel structures remain to stabilize the stack structure, thereby increasing the chance of stack structure collapse before the removed sacrificial layer is replaced with the sidewall semiconductor plugs (e.g., in a semiconductor layer).

Various embodiments in accordance with the present disclosure provide 3D memory devices with stabilization structures between memory blocks to improve production yield. The slit structures (either as front side source contacts or insulating structures) between memory blocks can be replaced with the stabilization structures, which are the remainders of the dielectric stack that are not replaced during the gate-replacement process in forming the memory stack. For example, parts of the stack sacrificial layers (e.g., silicon nitride layers) in the dielectric stack may remain intact during the gate-replacement process to hold the adjacent memory blocks during the gate-replacement process, thereby stabilizing the stack structure during fabrication. Similarly, part of the sacrificial layer can remain intact (as part of the stabilization structure) when replacing the sacrificial layer with the sidewall semiconductor plug to stabilize the dielectric stack in forming the sidewall semiconductor plug. Also, by eliminating the slit structures between memory blocks, slit openings etch loading can be reduced to further improve the production yield, and the slit structure pitch can be decreased to reduce the die size.

Figure 3A:
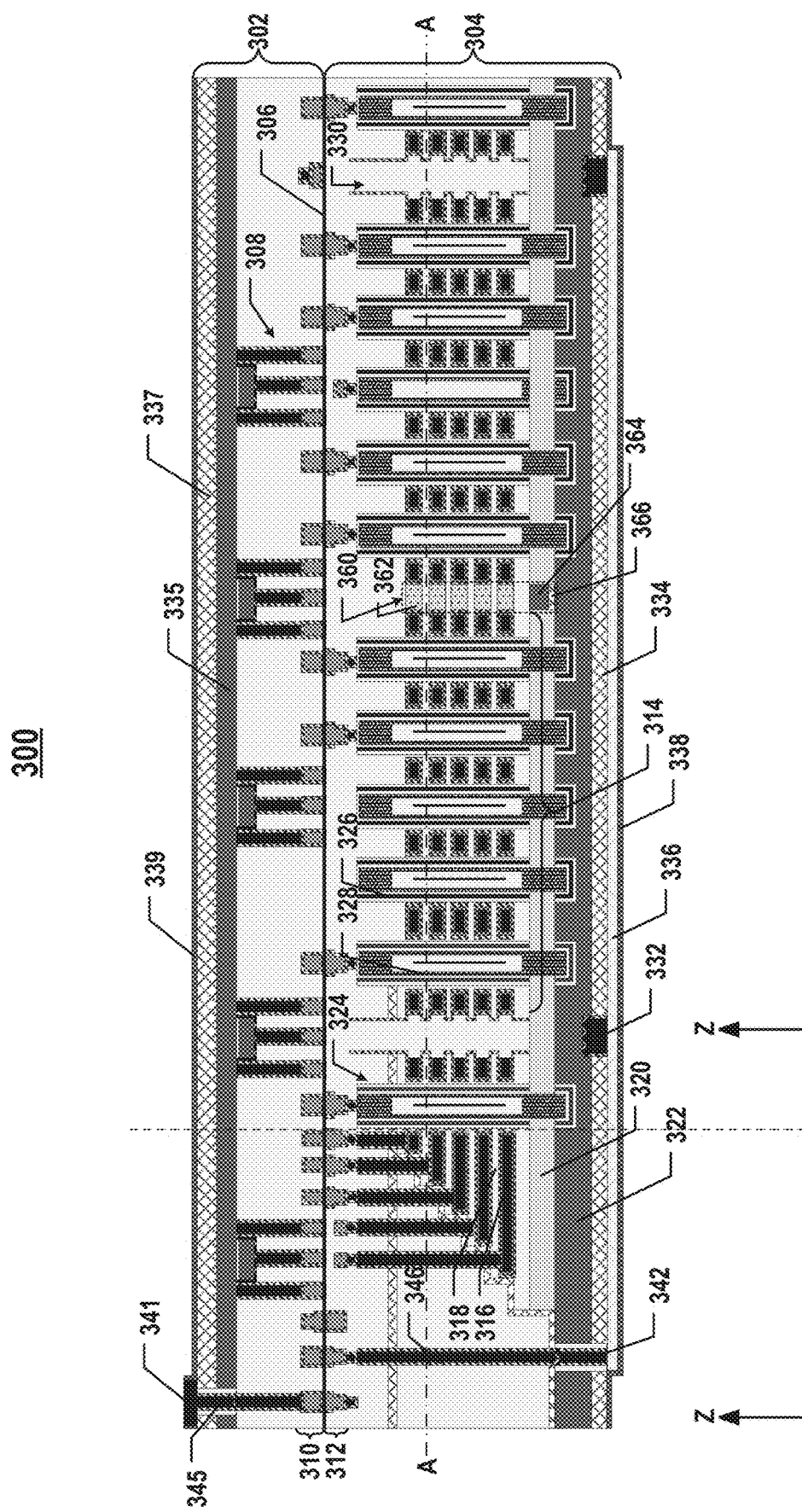
FIG. 3A illustrates a side view of a cross-section of an exemplary 3D memory device with stabilization structures between memory blocks, according to some embodiments of the present disclosure.

FIG. 3A illustrates a side view of a cross-section of an exemplary 3D memory device 300 with stabilization structures between memory blocks, according to some embodiments of the present disclosure. In some embodiments, 3D memory device 300 is a bonded chip including a first semiconductor structure 302 and a second semiconductor structure 304 bonded at a bonding interface 306 therebetween, according to some embodiments. Although first semiconductor structure 302 is stacked over second semiconductor structure 304 in FIG. 3A, it is understood that the relative positions of first and second semiconductor structures 302 and 304 may be reversed, e.g., second semiconductor structure 304 being stacked over first semiconductor structure 302, in other examples. Depending on the relative positions of first and second semiconductor structures 302 and 304, one of first and second semiconductor structures 302 and 304 can include a die substrate for packaging, which can include silicon (e.g., single crystalline silicon, c-Si), ceramic, glass, silicon germanium (SiGe), gallium arsenide (GaAs), germanium (Ge), silicon on insulator (SOI), or any other suitable materials.

First semiconductor structure 302 of 3D memory device 300 can include peripheral circuits 308 and a semiconductor layer 335 above peripheral circuits 308. It is noted that x-, y-, and z-axes are included in FIG. 3A to illustrate the spatial relationships of the components in 3D memory device 300. The die substrate of 3D memory device 300 includes two lateral surfaces extending laterally in the x-y plane: a front surface on the front side of the wafer, and a back surface on the backside opposite to the front side of the wafer. The x- and y-directions are two orthogonal directions in the wafer plane: x-direction is the word line direction, and the y-direction is the bit line direction. The z-axis is perpendicular to both the x- and y-axes. As used herein, whether one component (e.g., a layer or a device) is "on," "above," or "below" another component (e.g., a layer or a device) of a semiconductor device (e.g., 3D memory device 300) is determined relative to the die substrate of the semiconductor device in the z-direction (the vertical direction perpendicular to the x-y plane) when the die substrate is positioned in the lowest plane of the semiconductor device in the z-direction. The same notion for describing spatial relationships is applied throughout the present disclosure. It is understood that when the relative positions of first and second semiconductor structures 302 and 304 reverse, the spatial relationships of the components in 3D memory device 300 may change accordingly.

In some embodiments, peripheral circuit 308 is configured to control and sense the 3D memory device 300. Peripheral circuit 308 can be any suitable digital, analog, and/or mixed-signal control and sensing circuits used for facilitating the operation of 3D memory device 300 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). Peripheral circuits 308 can include transistors formed "on" semiconductor layer 335 (e.g., a thinned silicon substrate), in which the entirety or part of the transistors are formed in semiconductor layer 335 (e.g., above the bottom surface of semiconductor layer 335) and/or directly on semiconductor layer 335. Isolation regions (e.g., shallow trench isolations (STIs)) and doped regions (e.g., source regions and drain regions of the transistors) can be formed in semiconductor layer 335 as well. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments. It is understood that in some embodiments, peripheral circuit 308 may further include any other circuits compatible with the advanced logic processes including logic circuits, such as processors and programmable logic devices (PLDs) or memory circuits, such as static random-access memory (SRAM).

In some embodiments, first semiconductor structure 302 of 3D memory device 300 further includes a dielectric layer 337 and a passivation layer 339 above semiconductor layer 335. Dielectric layer 337 and passivation layer 339 are the topmost layers of 3D memory device 300 to electrically isolate and protect the underneath components of 3D memory device 300, according to some embodiments. First semiconductor structure 302 can further include contact pads 341 above dielectric layer 337 for wire bonding and/or bonding with an interposer. In some embodiments, first semiconductor structure 302 further includes a contact 345, such as a through silicon contact (TSC), extending vertically through semiconductor layer 335 and dielectric layer 337 to be in contact with contact pad 341 of 3D memory device 300.

In some embodiments, first semiconductor structure 302 of 3D memory device 300 further includes an interconnect layer (not shown) below peripheral circuits 308 to transfer electrical signals to and from peripheral circuits 308. The interconnect layer can include a plurality of interconnects (also referred to herein as "contacts"), including lateral interconnect lines and vertical interconnect access (VIA) contacts. As used herein, the term "interconnects" can broadly include any suitable types of interconnects, such as middle-end-of-line (MEOL) interconnects and back-end-of-line (BEOL) interconnects. The interconnect layer can further include one or more interlayer dielectric (ILD) layers (also known as "intermetal dielectric (IMD) layers") in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, tungsten (W), cobalt (Co), copper (Cu), aluminum (Al), silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

As shown in FIG. 3A, first semiconductor structure 302 of 3D memory device 300 can further include a bonding layer 310 at bonding interface 306 and below the interconnect layer and peripheral circuits 308. Bonding layer 310 can include a plurality of bonding contacts and dielectrics electrically isolating the bonding contacts. The bonding contacts can include conductive materials including, but not limited to, W, Co, Cu, Al, silicides, or any combination thereof. The remaining area of bonding layer 310 can be formed with dielectrics including, but not limited to, silicon oxide, silicon nitride, silicon oxynitride, low-k dielectrics, or any combination thereof. The bonding contacts and surrounding dielectrics in bonding layer 310 can be used for hybrid bonding.

Similarly, as shown in FIG. 3A, second semiconductor structure 304 of 3D memory device 300 can also include a bonding layer 312 at bonding interface 306 and below bonding layer 310 of first semiconductor structure 302. Bonding layer 312 can include a plurality of bonding contacts and dielectrics electrically isolating the bonding contacts. The bonding contacts and surrounding dielectrics in bonding layer 312 can be used for hybrid bonding with bonding layer 310 at bonding interface 306. As described below in detail, first semiconductor structure 302 can be bonded on top of second semiconductor structure 304 in a face-to-face manner at bonding interface 306. In some embodiments, bonding interface 306 is disposed between bonding layers 310 and 312 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 306 is the place at which bonding layers 312 and 310 are met and bonded. In practice, bonding interface 306 can be a layer with a certain thickness that includes the bottom surface of bonding layer 310 of first semiconductor structure 302 and the top surface of bonding layer 312 of second semiconductor structure 304.

In some embodiments, second semiconductor structure 304 of 3D memory device 300 further includes an interconnect layer (not shown) below bonding layer 312 to transfer electrical signals. The interconnect layer can include a plurality of interconnects, such as MEOL interconnects and BEOL interconnects. The interconnect layer can further include one or more ILD layers in which the interconnect lines and VIA contacts can form. The interconnect lines and VIA contacts in the interconnect layer can include conductive materials including, but not limited to W, Co, Cu, Al, silicides, or any combination thereof. The ILD layers in the interconnect layer can include dielectric materials including, but not limited to, silicon oxide, silicon nitride, silicon oxynitride, low-k dielectrics, or any combination thereof.

Figure 4:
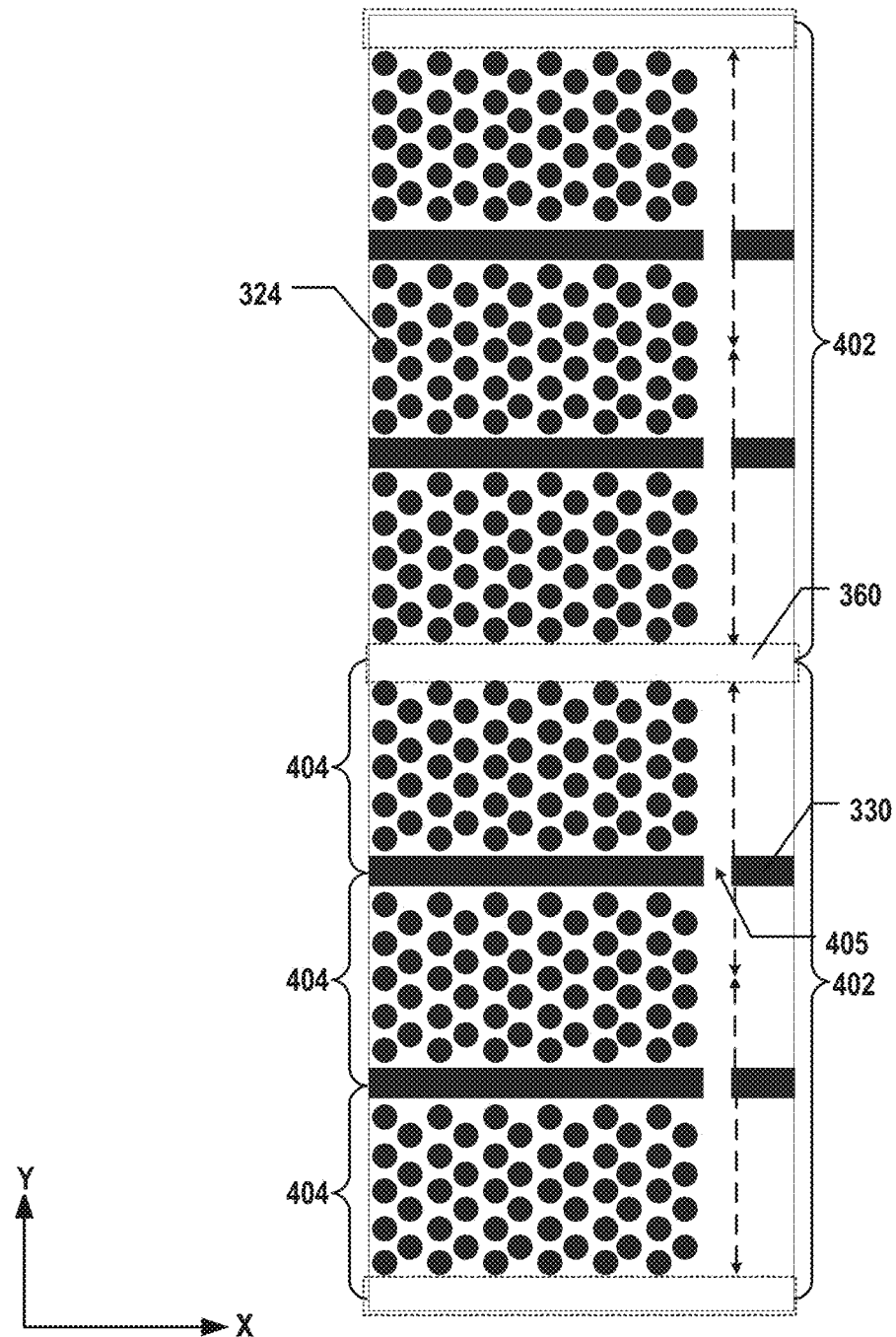
FIG. 4 illustrates a plan view of a cross-section of an exemplary 3D memory device with stabilization structures between memory blocks, according to some embodiments of the present disclosure.

In some embodiments, 3D memory device 300 is a NAND Flash memory device in which memory cells are provided in the form of an array of NAND memory strings. As shown in FIG. 3A, second semiconductor structure 304 of 3D memory device 300 can include an array of channel structures 324 functioning as the array of NAND memory strings. FIG. 4 illustrates a plan view of a cross-section of an exemplary 3D memory device with stabilization structures between memory blocks, according to some embodiments of the present disclosure. FIG. 4 shows one example of the plan view of the cross-section at the AA plane of second semiconductor structure 304 of 3D memory device 300 shown in FIG. 3A, according to some embodiments.

As shown in FIG. 4, second semiconductor structure 304 of 3D memory device 300 can include a plurality of memory blocks 402 arranged in the y-direction (e.g., the bit line direction) in the plan view. Each memory block 402 can include a plurality of memory fingers 404 arranged in the y-direction and a plurality of slit structures 330 each between adjacent memory fingers 404 in the y-direction in the plan view. Each memory finger 404 can include an array of channel structures 324. That is, memory block 402 includes a plurality of channel structures 324, and at least one slit structure 330 having "H" cuts 405 extends laterally in the x-direction (e.g., the word line direction) to form memory fingers 404 in memory block 402, according to some embodiments. That is, slit structure 330 between memory fingers 404 within memory block 402 can include one or more "H" cuts 405 that connect memory stack 314 between adjacent memory fingers 204 in the same memory block 402.

Different from FIG. 2 in which adjacent memory blocks 202 are separated by slit structures 130 as well, like memory fingers, in FIG. 4, adjacent memory blocks 402 are separated by stabilization structures 360 having a different structure as slit structure 330 as described below in detail, according to some embodiments. That is, second semiconductor structure 304 of 3D memory device 300 can also include at least one stabilization structure 360 each between adjacent memory blocks 402 in the y-direction (e.g., the bit line direction) in the plan view. In some embodiments, each stabilization structure 360 extends laterally in the x-direction (e.g., the word line direction) to separate adjacent memory blocks 402 in the plan view.

Referring back to FIG. 3A, outside of stabilization structures 360 (in each memory block 402 in FIG. 4), each channel structure 324 can extend vertically through a plurality of pairs each including a stack conductive layer 316 and a stack dielectric layer 318. The interleaved stack conductive layers 316 and stack dielectric layers 318 form a memory stack 314 in each memory block 402, according to some embodiments. That is, each memory block 402 can include a memory stack 314 including vertically interleaved stack conductive layers 316 and stack dielectric layers 318. The number of the pairs of stack conductive layers 316 and stack dielectric layers 318 in memory stack 314 (e.g., 32, 64, 96, 128, 160, 192, 224, 256, or more) determines the number of memory cells in 3D memory device 300. It is understood that in some embodiments, memory stack 314 may have a multi-deck architecture (not shown), which includes a plurality of memory decks stacked over one another. The numbers of the pairs of stack conductive layers 316 and stack dielectric layers 318 in each memory deck can be the same or different.

Memory stack 314 can include a plurality of interleaved stack conductive layers 316 and stack dielectric layers 318. Stack conductive layers 316 and stack dielectric layers 318 in memory stack 314 can alternate in the vertical direction. In other words, except the ones at the top or bottom of memory stack 314, each stack conductive layer 316 can be adjoined by two stack dielectric layers 318 on both sides, and each stack dielectric layer 318 can be adjoined by two stack conductive layers 316 on both sides. Stack conductive layers 316 can include conductive materials including, but not limited to, W, Co, Cu, Al, polysilicon, doped silicon, silicides, or any combination thereof. Each stack conductive layer 316 can include a gate electrode (gate line) surrounded by an adhesive layer and a gate dielectric layer. The gate electrode of stack conductive layer 316 can extend laterally as a word line, ending at one or more staircase structures of memory stack 314. Stack dielectric layers 318 can include dielectric materials including, but not limited to, silicon oxide, silicon nitride, silicon oxynitride, or any combination thereof. In some embodiments, stack conductive layers 316 include metals, such as W, and stack dielectric layers 318 include silicon oxide.

As shown in FIG. 3A, between adjacent memory stacks 314, a stabilization structure 360 includes a dielectric stack in the same plane as memory stacks 314, according to some embodiments. The dielectric stack of stabilization structure 360 can include vertically interleaved stack dielectric layers 362 and stack dielectric layers 318. As described below in detail with respect to the fabrication process, memory stacks 314 can be formed by replacing parts of a dielectric stack, and the remainders of the dielectric stack can become the dielectric stacks of stabilization structures 360 in second semiconductor structure 304 of 3D memory device 300. That is, memory stacks 314 and the dielectric stacks of stabilization structures 360 originate from the same dielectric stack, according to some embodiments. As a result, each stack dielectric layer 318, such as a silicon oxide layer, can extend laterally across stabilization structures 360 and memory stacks 314. That is, coplanar stack dielectric layers 318 in stabilization structures 360 and memory stacks 314 can be a continuous layer, such as a silicon oxide layer. Each stack dielectric layer 362 of stabilization structure 360 can be coplanar with a respective one of stack conductive layers 316 in memory stacks 314. In some embodiments, stack dielectric layer 362 of stabilization structure 360 is in contact with coplanar stack conductive layers 316 in adjacent memory blocks 314. As described below in detail with respect to the fabrication process, stack conductive layers 316 in memory stacks 314 can be formed by replacing parts of stack sacrificial layers in the dielectric stack, and the remainders of the stack sacrificial layers can become stack dielectric layers 362 of stabilization structures 360 in second semiconductor structure 304 of 3D memory device 300.

As shown in FIG. 3A, outside of stabilization structures 360 (in each memory block 402 in FIG. 4), second semiconductor structure 304 of 3D memory device 300 can also include a first semiconductor layer 320 below memory stack 314 and a second semiconductor layer 322 below and in contact with first semiconductor layer 320. In some embodiments, each of first and second semiconductor layers 320 and 322 is an N-type doped semiconductor layer, e.g., a silicon layer doped with N-type dopant(s), such as phosphorus (P) or arsenic (As). In some embodiments, second semiconductor layer 322 is an N-well in a silicon substrate. First semiconductor layer 320 includes polysilicon, for example, N-type doped polysilicon, according to some embodiments.

In some embodiments, each channel structure 324 includes a channel hole filled with a semiconductor layer (e.g., as a semiconductor channel 328) and a composite dielectric layer (e.g., as a memory film 326). In some embodiments, semiconductor channel 328 includes silicon, such as amorphous silicon, polysilicon, or single crystalline silicon. For example, semiconductor channel 328 may include polysilicon. In some embodiments, memory film 326 is a composite layer including a tunneling layer, a storage layer (also known as a "charge trap layer"), and a blocking layer. The remaining space of channel structure 324 can be partially or fully filled with a capping layer including dielectric materials, such as silicon oxide, and/or an air gap. Channel structure 324 can have a cylinder shape (e.g., a pillar shape). The capping layer, semiconductor channel 328, the tunneling layer, storage layer, and blocking layer of memory film 326 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, memory film 326 can include a composite layer of silicon oxide/silicon oxynitride/silicon oxide (ONO).

In some embodiments, channel structure 324 further includes a channel plug in the top portion (e.g., at the upper end) of channel structure 324. As used herein, the "upper end" of a component (e.g., channel structure 324) is the end farther away from the die substrate in the z-direction, and the "lower end" of the component (e.g., channel structure 324) is the end closer to the die substrate in the z-direction when the die substrate is positioned in the lowest plane of 3D memory device 300. The channel plug can include semiconductor materials (e.g., polysilicon). In some embodiments, the channel plug functions as the drain of the NAND memory string.

As shown in FIG. 3A, each channel structure 324 can extend vertically through interleaved stack conductive layers 316 and stack dielectric layers 318 of memory stack 314 and first semiconductor layer 320, e.g., an N-type doped polysilicon layer. In some embodiments, first semiconductor layer 320 surrounds part of channel structure 324 and is in contact with semiconductor channel 328 including polysilicon. That is, memory film 326 is disconnected at part of channel structure 324 that abuts first semiconductor layer 320, exposing semiconductor channel 328 to be in contact with the surrounding first semiconductor layer 320, according to some embodiments. As a result, first semiconductor layer 320 surrounding and in contact with semiconductor channel 328 can work as a "sidewall semiconductor plug" of channel structure 324. In some embodiments, each channel structure 324 can extend vertically further into second semiconductor layer 322, e.g., an N-type doped polysilicon or single crystalline silicon layer. That is, each channel structure 324 extends vertically through memory stack 314 into the N-type doped semiconductor layer (including first and second semiconductor layers 320 and 322), according to some embodiments. In some embodiments, each of first and second semiconductor layers 320 and 322 is an N-type doped semiconductor layer to enable gate-induce-drain-leakage (GIDL)-assisted body biasing for erase operations. The GIDL around the source select gate of the NAND memory string can generate hole current into the NAND memory string to raise the body potential for erase operations.

It is understood that first and second semiconductor layers 320 and 322 illustrate one example of a semiconductor layer that can be used for second semiconductor structure 304 of 3D memory device 300. In a more general case, second semiconductor structure 304 of 3D memory device 300 may include a semiconductor layer having one or more doped silicon layers, such as doped polysilicon layer(s) and/or doped single crystalline silicon layer(s). Moreover, the number of the doped silicon layers in the semiconductor layer and the doping type of each silicon layer in the semiconductor layer are not limited by the example above with respect to FIG. 3A and may vary in other examples. For example, a third semiconductor layer (not shown) may be formed above and in contact with first semiconductor layer 320, i.e., vertically between first semiconductor layer 320 and memory stack 314. It is also understood that the relative position of channel structure 324 with respect to the semiconductor layer is not limited by the example above with respect to FIG. 3A and may vary in other examples. In a more general case, each channel structure 324 may extend vertically through memory stack 314 into the semiconductor layer regardless of the relative position of the end of channel structure 324 with respect to each doped silicon layer in the semiconductor layer. It is further understood that the erase operation performed by 3D memory device 300 is not limited to GIDL erase in the example above with respect to FIG. 3A and may be P-well bulk erase operation or any other suitable erase operations based on different configurations of the semiconductor layer, for example, the doping type of each doped silicon layer in the semiconductor layer.

As shown in FIG. 3A, stabilization structure 360 can further include a residual sacrificial layer 364 and a residual stop layer 366 below the dielectric stack of stabilization structure 360. In some embodiments, residual stop layer 366 is disposed on second semiconductor layer 322, and residual sacrificial layer 364 is disposed on residual stop layer 366. Residual stop layer 366 can overlap residual sacrificial layer 364 in a lateral direction, e.g., the y-direction. Each of residual stop layer 366 and residual sacrificial layer 364 can overlap the dielectric stack of stabilization structure 360 in a lateral direction as well, e.g., the y-direction. In some embodiments, the dielectric stack, residual stop layer 366, and residual sacrificial layer 364 of stabilization structure 360 are aligned with one another in a lateral direction (e.g., the y-direction) and have the same lateral dimension (e.g., the width in the y-direction). As described below in detail with respect to the fabrication process, first semiconductor layers 320 can be formed by replacing parts of a sacrificial layer (and a stop layer underneath), and the remainders of the sacrificial layer and stop layer can become residual sacrificial layer 364 and residual stop layer 366 of stabilization structures 360 in second semiconductor structure 304 of 3D memory device 300. As a result, in some embodiments, first semiconductor layer 320 is coplanar with residual sacrificial layer 364 and residual stop layer 366. In some embodiments, residual sacrificial layer 364 includes polysilicon or silicon nitride, and residual stop layer 366 includes silicon oxide.

It is understood that stabilization structure 360 may not include residual stop layer 366 in some examples, for example, in which residual sacrificial layer 364 includes silicon nitride, or any other suitable materials that are different from the material of first semiconductor layer. In these examples, first semiconductor layer 320 may be coplanar with residual sacrificial layer 364. It is also understood that stabilization structure 360 may include another residual stop layer (not shown) on residual sacrificial layer 364 in some examples, for example, in which a third semiconductor layer (not shown) is formed vertically between first semiconductor layer 320 and memory stacks 314. In these examples, first semiconductor layer 320 may be coplanar with the two residual stop layers and residual sacrificial layer 364 sandwiched between the two residual stop layers.

As shown in FIG. 3A, second semiconductor structure 304 of 3D memory device 300 can further include slit structures 330 each extending vertically through interleaved stack conductive layers 316 and stack dielectric layers 318 of memory stack 314. Different from channel structure 324 that extends further through first semiconductor layer 320, slit structures 330 stops at first semiconductor layer 320, according to some embodiments. As shown in FIG. 4, each slit structure 330 can also extend laterally to separate channel structures 324 into memory fingers 404. That is, each memory stack 314 can be divided into a plurality of memory fingers by slit structures 330, such that the array of channel structures 324 can be separated into each memory finger 404. It is understood that the relative position of slit structure 330 with respect to first semiconductor layer 320 is not limited by the example above with respect to FIG. 3A and may vary in other examples. For example, slit structure 330 may extend further into first semiconductor layer 320.

In some embodiments, each slit structure 330 is an insulating structure that does not include any contact therein (i.e., not functioning as the source contact) and thus, does not introduce parasitic capacitance and leakage current with stack conductive layers 316 (including word lines), according to some embodiments. In some embodiments, each slit structure 330 includes an opening (e.g., a slit opening) filled with one or more dielectric materials, including, but not limited to, silicon oxide, silicon nitride, silicon oxynitride, or any combination thereof. It is understood that in some examples, slit structure 330 may be a front side source contact having a conductive portion (e.g., including W, polysilicon, and/or titanium nitride (TiN)) and a spacer (e.g., including dielectrics), for example, like slit structure 130 shown in FIG. 1. Nevertheless, in FIGS. 3A and 4, slit structure 330 for separating memory fingers 404 within a memory block 402 and stabilization structure 360 for separating memory blocks 402 have different structures as described above in detail. In contrast, second semiconductor structure 104 in 3D memory device 100 in FIGS. 1 and 2 use slit structures 130 for separating memory fingers 204 as well as memory blocks 202. That is, slit structures 130 between memory blocks 202 are replaced with stabilization structures 360 between memory blocks 402.

Referring back to FIG. 3A, 3D memory device 300 can include a backside source contact 332 below memory stack 314 and in contact with second semiconductor layer 322.

Source contact 332 and memory stack 314 can be disposed on opposites sides of second semiconductor layer 322 (e.g., a thinned substrate) and thus, viewed as a "backside" source contact. In some embodiments, source contact 332 extends further into second semiconductor layer 322 and is electrically connected to first semiconductor layer 320 and semiconductor channel 328 of channel structure 324 through second semiconductor layer 322. Source contact 332 can include one or more conductive layers, such as a metal layer (e.g., W, Co, Cu, or Al) or a silicide layer surrounded by an adhesive layer (e.g., titanium nitride (TiN)).

Figure 3B:
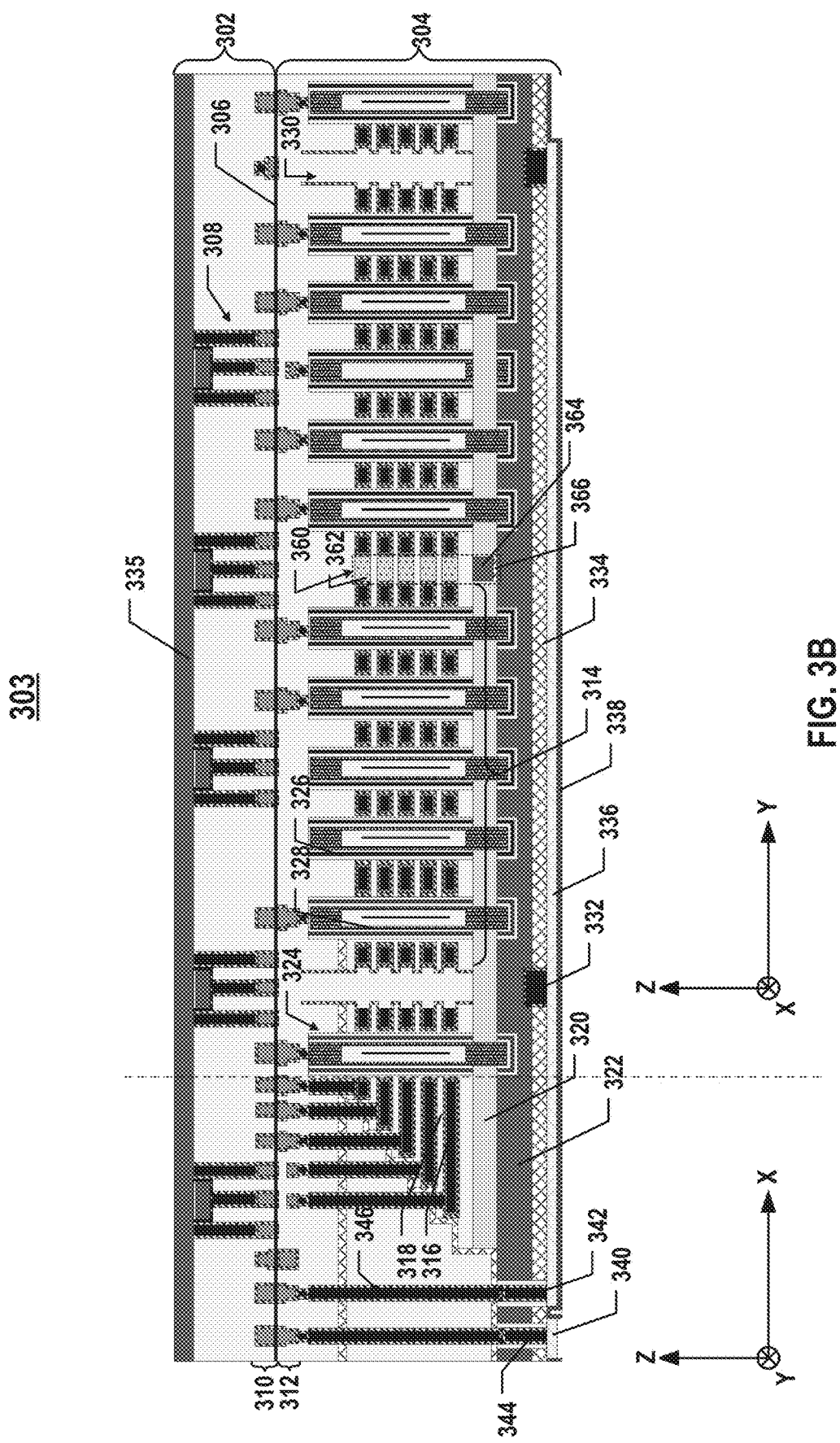
FIG. 3B illustrates a side view of a cross-section of another exemplary 3D memory device with stabilization structures between memory blocks, according to some embodiments of the present disclosure.
Figure 3C:
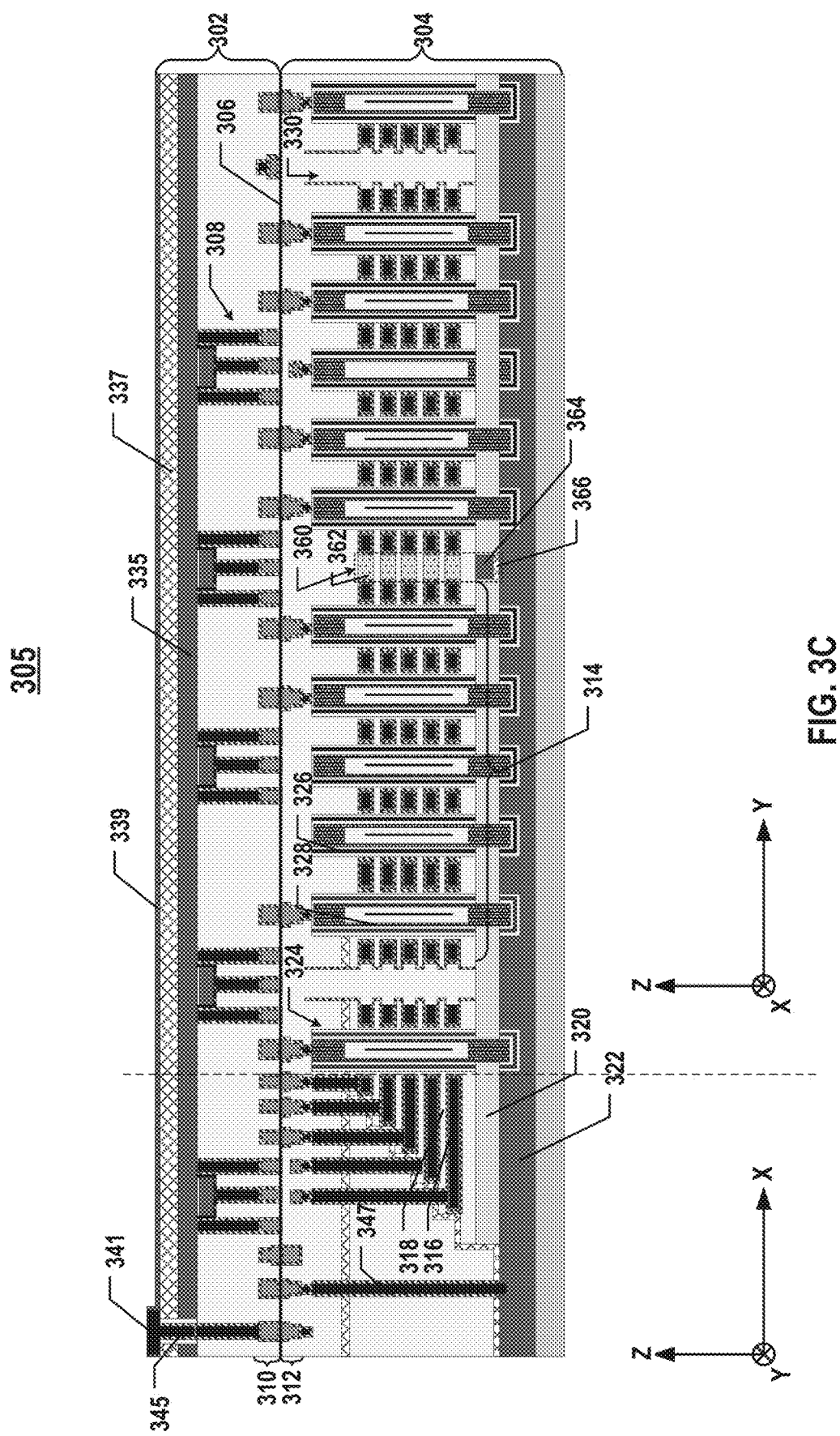
FIG. 3C illustrates a side view of a cross-section of still another exemplary 3D memory device with stabilization structures between memory blocks, according to some embodiments of the present disclosure.
Figure 3D:
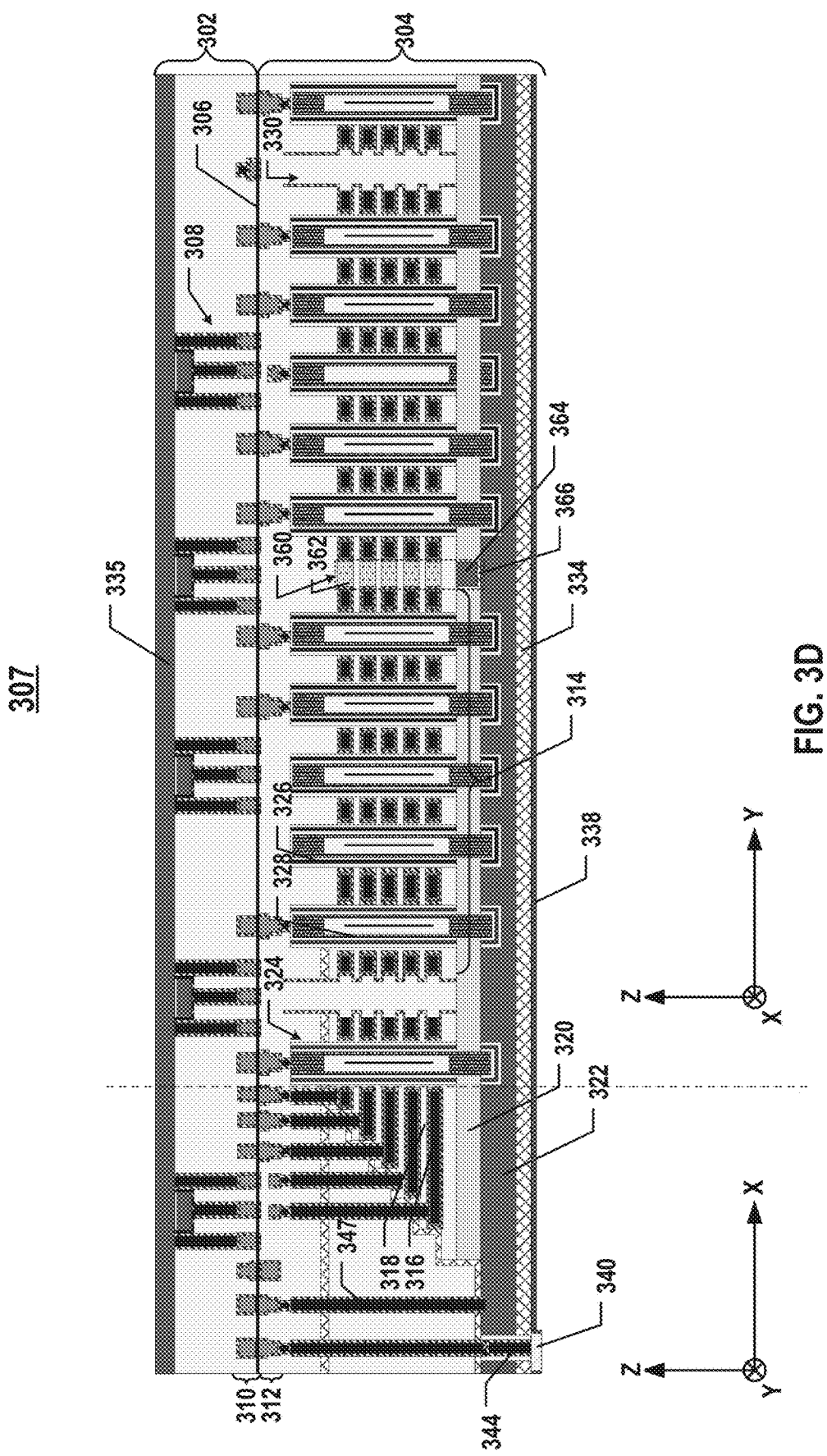
FIG. 3D illustrates a side view of a cross-section of yet another exemplary 3D memory device with stabilization structures between memory blocks, according to some embodiments of the present disclosure.

As shown in FIG. 3A, 3D memory device 300 can further include a BEOL interconnect layer below second semiconductor layer 322 for pad-out, e.g., transferring electrical signals between 3D memory device 300 and external circuits. In some embodiments, the interconnect layer includes one or more ILD layers 334 below second semiconductor layer 322 and a redistribution layer 336 below ILD layers 334. Redistribution layer 336 can include conductive materials including, but not limited to W, Co, Cu, Al, silicides, or any combination thereof. In some embodiments, the interconnect layer further includes a passivation layer 338 as the bottom-most layer for passivation and protection of 3D memory device 300.

In some embodiments, second semiconductor structure 304 of 3D memory device 300 also includes contacts 342 (e.g., TSCs) extending through second semiconductor layer 322 and ILD layers 334. In some embodiments, 3D memory device 300 further includes peripheral contacts 346 extending vertically to second semiconductor layer 322 outside of memory stack 314. In some embodiments, peripheral contact 346 is above and in contact with contact 342, such that first semiconductor layer 320 is electrically connected to peripheral circuit 308 in first semiconductor structure 302 through at least second semiconductor layer 322, source contact 332, redistribution layer 336, contact 342, and peripheral contact 346.

FIG. 3B illustrates a side view of a cross-section of another exemplary 3D memory device 303 with stabilization structures 360 between memory blocks 402, according to some embodiments of the present disclosure. 3D memory device 303 is similar to 3D memory device 300 in FIG. 3A except that contact pad 341 above dielectric layer 337 in first semiconductor structure 302 is replaced by a contact pad 340 below ILD layer 334 in second semiconductor structure 304, according to some embodiments. As shown in FIG. 3B, second semiconductor structure 304 can further include a contact 344 (e.g., TSC) extending vertically through second semiconductor layer 322 and ILD layer 334 to be in contact with contact pad 340. It is understood that the details of other same structures in both 3D memory devices 303 and 300 are not repeated for ease of description.

FIG. 3C illustrates a side view of a cross-section of still another exemplary 3D memory device 305 with stabilization structures 360 between memory blocks 402, according to some embodiments of the present disclosure. 3D memory device 305 is similar to 3D memory device 300 in FIG. 3A except that backside source contact 332 in 3D memory device 100 is replaced by a front side source contact 347 in 3D memory device 305, according to some embodiments. As shown in FIG. 3C, source contact 347 can be disposed above and in contact with second semiconductor layer 322. That is, source contact 347 and memory stack 314 can be disposed on the same side, e.g., the front side, of second semiconductor layer 322 (e.g., a thinned substrate). It is understood that the details of other same structures in both 3D memory devices 305 and 300 are not repeated for ease of description.

FIG. 3D illustrates a side view of a cross-section of yet another exemplary 3D memory device 307 with stabilization structures 360 between memory blocks 402, according to some embodiments of the present disclosure. 3D memory device 307 is similar to 3D memory device 305 in FIG. 3C except that contact pad 341 above dielectric layer 337 in first semiconductor structure 302 is replaced by contact pad 340 below ILD layer 334 in second semiconductor structure 304, according to some embodiments. As shown in FIG. 3D, second semiconductor structure 304 can further include contact 344 (e.g., TSC) extending vertically through second semiconductor layer 322 and ILD layer 334 to be in contact with contact pad 340. It is understood that the details of other same structures in both 3D memory devices 307 and 305 are not repeated for ease of description.

FIGS. 5A-5G illustrate a fabrication process for forming an exemplary 3D memory device with stabilization structures between memory blocks, according to some embodiments of the present disclosure. FIG. 6 illustrates a flowchart of a method 600 for forming an exemplary 3D memory device with stabilization structures between memory blocks, according to some embodiments of the present disclosure. Examples of the 3D memory device depicted in FIGS. 5A-5G and 6 include 3D memory devices 300, 303, 305, and 307 depicted in FIGS. 3A-3D. FIGS. 5A-5G and 6 will be described together. It is understood that the operations shown in method 600 are not exhaustive and that other operations can be performed as well before, after, or between any of the illustrated operations. Further, some of the operations may be performed simultaneously, or in a different order than shown in FIG. 6.

Referring to FIG. 6, method 600 starts at operation 602, in which a peripheral circuit is formed on a first substrate. The first substrate can be a silicon substrate. As illustrated in FIG. 5G, a plurality of transistors are formed on a silicon substrate 550 using a plurality of processes including, but not limited to, photolithography, etching, thin film deposition, thermal growth, implantation, chemical mechanical polishing (CMP), and any other suitable processes. In some embodiments, doped regions (not shown) are formed in silicon substrate 550 by ion implantation and/or thermal diffusion, which function, for example, as source regions and/or drain regions of the transistors. In some embodiments, isolation regions (e.g., STIs) are also formed in silicon substrate 550 by wet etching and/or dry etching and thin film deposition. The transistors can form peripheral circuits 552 on silicon substrate 550.

As illustrated in FIG. 5G, a bonding layer 548 is formed above peripheral circuits 552. Bonding layer 548 includes bonding contacts electrically connected to peripheral circuits 552. To form bonding layer 548, an ILD layer is deposited using one or more thin film deposition processes, such as chemical vapor deposition (CVD), physical vapor deposition (PVD), atomic layer deposition (ALD), or any combination thereof, and the bonding contacts are formed through the ILD layer using wet etching and/or dry etching, e.g., reactive ion etch (RIE), followed by one or more thin film deposition processes, such as ALD, CVD, PVD, any other suitable processes, or any combination thereof.

Method 600 proceeds to operation 604, as illustrated in FIG. 6, in which a stop layer on a second substrate and a sacrificial layer on the stop layer are sequentially formed. The sacrificial layer can include polysilicon or silicon nitride, and the stop layer can include silicon oxide. In some embodiments, a semiconductor layer, such as an N-well, is formed in the top portion of the second substrate.

As illustrated in FIG. 5A, a semiconductor layer 504 is formed in the top portion of a silicon substrate 502. Semiconductor layer 504 can include an N-well in a P-type silicon substrate 502. Semiconductor layer 504 can be formed by doping N-type dopant(s), such as P or As, into P-type silicon substrate 502 using ion implantation and/or thermal diffusion. As illustrated in FIG. 5A, a stop layer 505 is formed on semiconductor layer 504 of silicon substrate 502 by depositing dielectric materials, such as silicon oxide, thermal oxidation, or any suitable materials different from the materials of semiconductor layer 504 and sacrificial layer 506, on semiconductor layer 504. In some embodiments, sacrificial layer 506 is then formed on stop layer 505. Sacrificial layer 506 can be formed by depositing polysilicon, silicon nitride, or any other suitable sacrificial material (e.g., carbon) that can be later selectively removed using one or more thin film deposition processes including, but not limited to, CVD, PVD, ALD, or any combination thereof.

Method 600 proceeds to operation 606, as illustrated in FIG. 6, in which a dielectric stack including vertically interleaved first dielectric layers and second dielectric layers is formed above the sacrificial layer. The first dielectric layers can include silicon oxide, and the second dielectric layers can include silicon nitride. In some embodiments, to form the dielectric stack, the first dielectric layers and the second dielectric layers are alternatingly deposited on the sacrificial layer.

As illustrated in FIG. 5A, a dielectric stack 508 including a plurality pairs of a first dielectric layer 510 and a second dielectric layer 512 is formed on sacrificial layer 506. Dielectric stack 508 includes vertically interleaved first dielectric layers 510 and second dielectric layers 512, according to some embodiments. First and second dielectric layers 510 and 512 can be alternatively deposited on sacrificial layer 506 above silicon substrate 502 to form dielectric stack 508. In some embodiments, each first dielectric layer 510 includes a layer of silicon oxide, and each second dielectric layer 512 includes a layer of silicon nitride. Dielectric stack 508 can be formed by one or more thin film deposition processes including, but not limited to, CVD, PVD, ALD, or any combination thereof. As illustrated in FIG. 5A, a staircase structure can be formed on the edge of dielectric stack 508. The staircase structure can be formed by performing a plurality of so-called "trim-etch" cycles to the dielectric layer pairs of dielectric stack 508 toward silicon substrate 502. Due to the repeated trim-etch cycles applied to the dielectric layer pairs of dielectric stack 508, dielectric stack 508 can have one or more tilted edges and a top dielectric layer pair shorter than the bottom one, as shown in FIG. 5A. Although not shown, it is understood that in some examples, another stop layer (e.g., a silicon oxide layer) and another semiconductor layer (e.g., a polysilicon layer) may be sequentially formed on sacrificial layer 506 prior to the formation of dielectric stack 508 using one or more thin film deposition processes including, but not limited to, CVD, PVD, ALD, or any combination thereof.

Method 600 proceeds to operation 608, as illustrated in FIG. 6, in which a plurality of channel structures each extending vertically through the dielectric stack and the sacrificial layer are formed. In some embodiments, to form the channel structure, a channel hole extending vertically through the dielectric stack and the sacrificial layer is formed, and a memory film and a semiconductor channel are sequentially formed over a sidewall of the channel hole.

As illustrated in FIG. 5B, a channel hole is an opening extending vertically through dielectric stack 508, sacrificial layer 506, and stop layer 505, into semiconductor layer 504. In some embodiments, a plurality of openings are formed, such that each opening becomes the location for growing an individual channel structure 514 in the later process. In some embodiments, fabrication processes for forming the channel hole of channel structure 514 include wet etching and/or dry etching, such as deep-ion reactive etching (DRIE). As illustrated in FIG. 5B, a memory film 516 (including a blocking layer, a storage layer, and a tunneling layer) and a semiconductor channel 518 are sequentially formed in this order along sidewalls and the bottom surface of the channel hole. In some embodiments, memory film 516 is first deposited along the sidewalls and bottom surface of the channel hole, and semiconductor channel 518 is then deposited over memory film 516. The blocking layer, storage layer, and tunneling layer can be subsequently deposited in this order using one or more thin film deposition processes, such as ALD, CVD, PVD, any other suitable processes, or any combination thereof, to form memory film 516. Semiconductor channel 518 can then be formed by depositing a semiconductor material, such as polysilicon, over the tunneling layer of memory film 516 using one or more thin film deposition processes, such as ALD, CVD, PVD, any other suitable processes, or any combination thereof. In some embodiments, a first silicon oxide layer, a silicon nitride layer, a second silicon oxide layer, and a polysilicon layer (a "SONO" structure) are subsequently deposited to form memory film 516 and semiconductor channel 518.

Method 600 proceeds to operation 610, as illustrated in FIG. 6, in which at least one opening extending vertically through the dielectric stack is formed. In some embodiments, part of the sacrificial layer is exposed from the at least one opening. In some embodiments, the at least one opening includes at least one slit extending laterally.

As illustrated in FIG. 5B, a slit opening 520 is an opening that extends vertically through dielectric stack 508 and exposes part of sacrificial layer 506. In some embodiments, fabrication processes for forming slit opening 520 include wet etching and/or dry etching, such as DRIE. In some embodiments, slit opening 520 extends further into the top portion of sacrificial layer 506. The etching process through dielectric stack 508 may not stop at the top surface of sacrificial layer 506 and may continue to etch part of sacrificial layer 506. Different from the fabrication process for forming 3D memory device 100 that forms slit openings (the same locations as slit structures 130 in FIG. 2) between memory blocks 202, as shown in FIG. 4, the slit openings (the same locations as slit structures 330) are formed between memory fingers 404, but not between memory blocks 402, according to some embodiments. By removing the slit openings between memory blocks 402, the etch loading of total slit openings can be reduced to increase the production yield.

Method 600 proceeds to operation 612, as illustrated in FIG. 6, in which parts of the sacrificial layer and the stop layer are replaced with a semiconductor layer through the at least one opening. In some embodiments, to replace the parts of the sacrificial layer and the stop layer with the semiconductor layer, the part of the sacrificial layer and the part of the stop layer are sequentially etched through the at least one opening to form a cavity, leaving the remainders of the sacrificial layer and the stop layer intact, and the semiconductor layer is deposited into the cavity through the at least one opening.

As illustrated in FIG. 5C, part of sacrificial layer 506 (shown in FIG. 5B) is removed by wet etching to form a cavity 522, leaving the remainder 507 of sacrificial layer 506 intact. In some embodiments, the part of sacrificial layer 506 is wet etched by applying a wet etchant through slit opening 520, which can be stopped by stop layer 505 vertically between sacrificial layer 506 and semiconductor layer 504. That is, the etching of sacrificial layer 506 does not affect semiconductor layer 504, according to some embodiments. The wet etchant can include phosphoric acid for etching sacrificial layer 506 including silicon nitride or tetramethylammonium hydroxide (TMAH) for etching sacrificial layer 506 including polysilicon. In some embodiments, the etching rate and/or etching time are controlled to remove only the part of sacrificial layer 506, leaving remainder 507 of sacrificial layer 506 intact. In some embodiments, prior to the etching of sacrificial layer 506, a spacer (not shown) is formed along the sidewall of slit opening 520. The spacer can be formed by depositing dielectric materials, such as silicon nitride, silicon oxide, and silicon nitride, into slit opening 520 using one or more thin film deposition processes, such as CVD, PVD, ALD, or any combination thereof.

As shown in FIG. 4, the wet etchant can be applied from the slit openings (the same locations as slit structures 330) to remove parts of sacrificial layer 506 within each memory block 402. By controlling the etching time, the wet etchant does not travel all the way to completely remove part of sacrificial layer 506 between adjacent memory blocks 402, leaving remainder 507 of sacrificial layer 506 between adjacent memory blocks 402, e.g., at the location of stabilization structure 360.

As illustrated in FIG. 5D, part of memory film 516 of channel structure 514 exposed in cavity 522 is removed to expose part of semiconductor channel 518 of channel structure 514 abutting cavity 522. In some embodiments, parts of the blocking layer (e.g., including silicon oxide), storage layer (e.g., including silicon nitride), and tunneling layer (e.g., including silicon oxide) are etched by applying etchants through slit opening 520 and cavity 522, for example, phosphoric acid for etching silicon nitride and hydrofluoric acid for etching silicon oxide. The etching can be stopped by semiconductor channel 518 of channel structure 514. The spacer including dielectric materials can also protect dielectric stack 508 from the etching of memory film 516 and can be removed by the etchants in the same step as removing part of memory film 516.

As illustrated in FIG. 5D, part of stop layer 505 (shown in FIG. 5C) is removed by wet etching, leaving the remainder 509 of stop layer 505 intact. In some embodiments, the part of stop layer 505 is wet etched by the same step as removing part of memory film 516. In some embodiments, the etching rate and/or etching time are controlled to remove only the part of stop layer 505, leaving remainder 509 of stop layer 505 intact. As a result, remainders 507 and 509 of sacrificial layer 506 and stop layer 505 can remain in cavity 522 after etching sacrificial layer 506 and stop layer 505 to provide additional supports between silicon substrate 502 and dielectric stack 508 to stabilize and avoid collapse, thereby increasing the production yield.

Figure 5E:
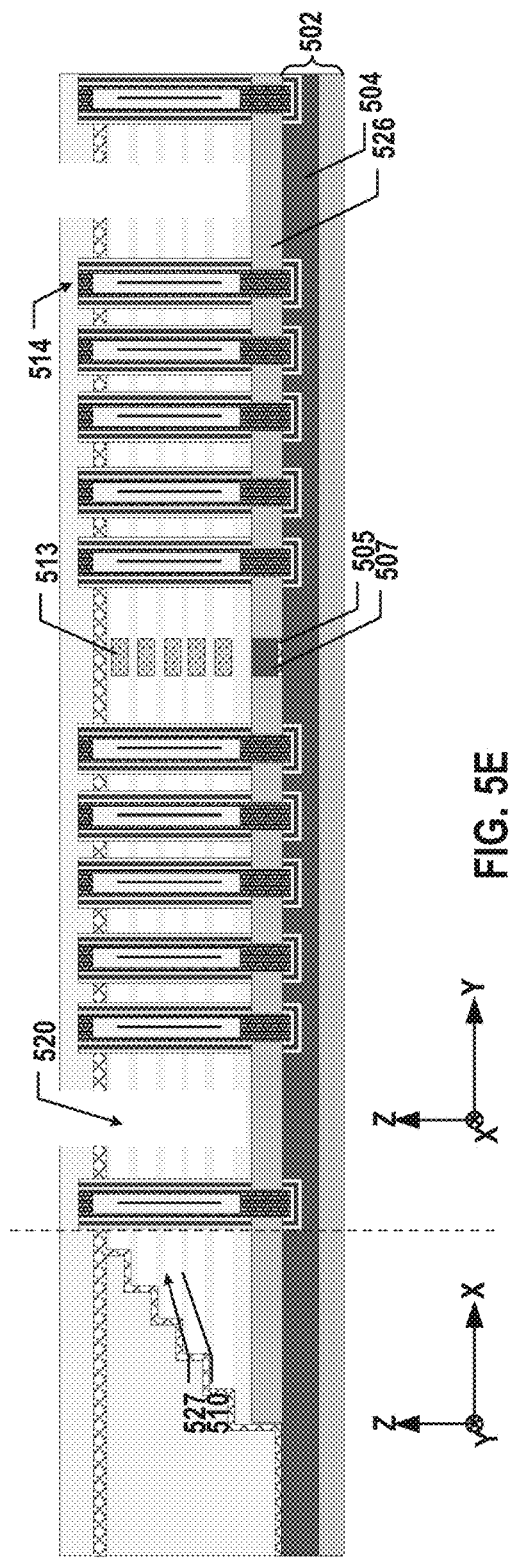
Figure 6:
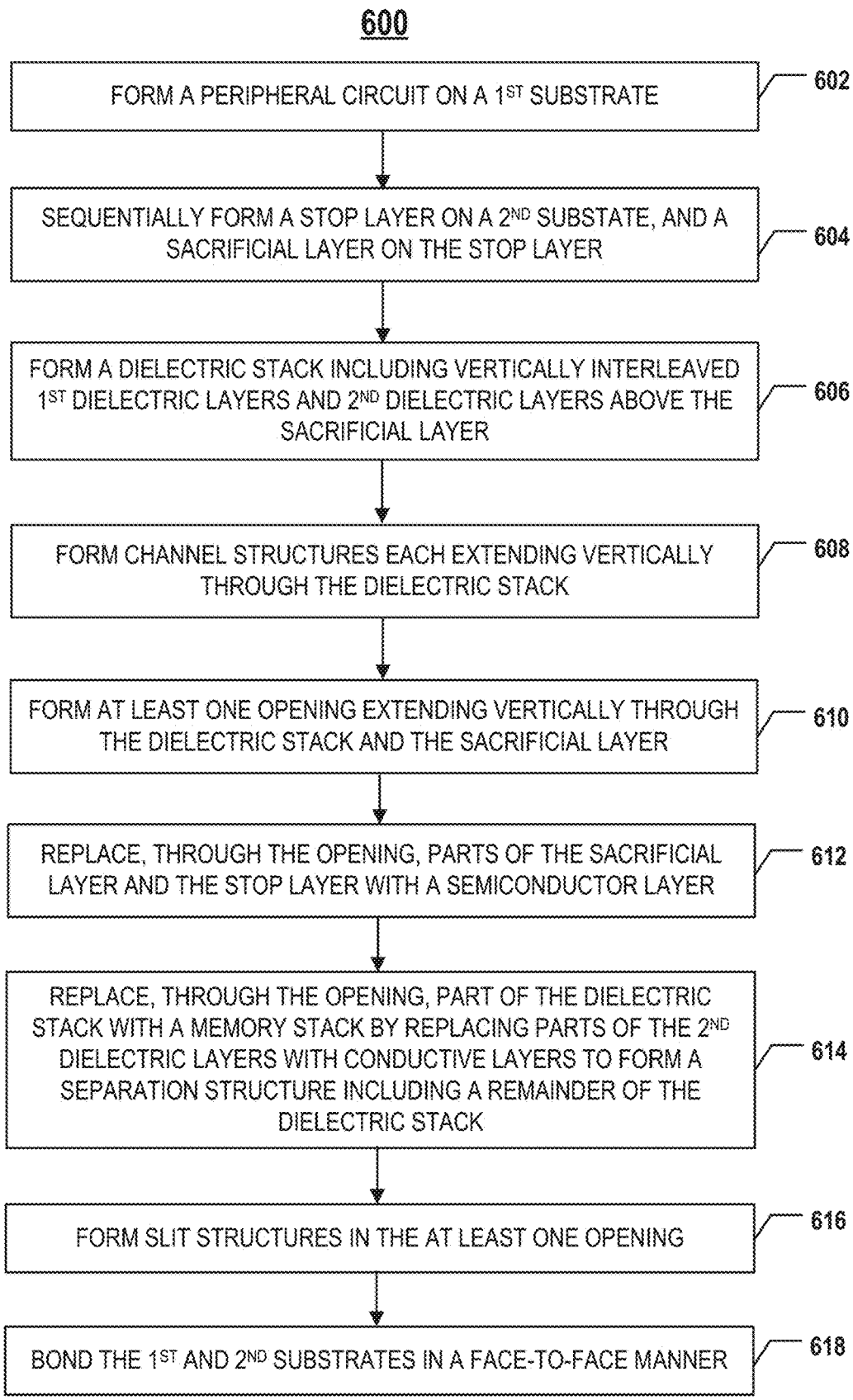
FIG. 6 illustrates a flowchart of a method for forming an exemplary 3D memory device with stabilization structures between memory blocks, according to some embodiments of the present disclosure.

As illustrated in FIG. 5E, a semiconductor layer 526 is formed above and in contact with semiconductor layer 504. In some embodiments, semiconductor layer 526 is formed by depositing polysilicon into cavity 522 (shown in FIG. 5D) through slit openings 520 using one or more thin film deposition processes, such as CVD, PVD, ALD, or any combination thereof. In some embodiments, in-situ doping of N-type dopants, such as P or As, is performed when depositing polysilicon to form an N-type doped polysilicon layer as semiconductor layer 526. Semiconductor layer 526 can fill cavity 522 to be in contact with the exposed part of semiconductor channel 518 of channel structure 514. Semiconductor layer 526 is also coplanar with remainders 507 and 509 of sacrificial layer 506 and stop layer 505, according to some embodiments. In some embodiments, cavity 522 is fully filled with semiconductor layer 526, such that semiconductor layer 526 is in contact with remainders 507 and 509 of sacrificial layer 506 and stop layer 505, as shown in FIG. 5E.

Method 600 proceeds to operation 614, as illustrated in FIG. 6, in which part of the dielectric stack is replaced with a memory stack through the at least one opening by replacing parts of the second dielectric layers with conductive layers to form a stabilization structure including a remainder of the dielectric stack. In some embodiments, to replace the part of the dielectric stack with the memory stack, the parts of the second dielectric layers are etched through the at least one opening to form recesses, leaving remainders of the second dielectric layers intact, and the conductive layers are deposited through the at least one opening into the recesses. In some embodiments, the conductive layers are in contact with the remainders of the second dielectric layers, respectively, after depositing the conductive layers. In some embodiments, the stabilization structure is formed laterally between two openings of the at least one opening. In some embodiments, the remainder of the dielectric stack is above and overlaps the remainders of the sacrificial layer and the stop layer in the stabilization structure.

As illustrated in FIG. 5E, parts of second dielectric layers 512 (shown in FIG. 5D) are removed by wet etching to form lateral recesses 527, leaving the remainders 513 of second dielectric layers 512 intact. In some embodiments, the parts of second dielectric layers 512 are wet etched by applying a wet etchant through slit opening 520, creating lateral recesses 527 interleaved between first dielectric layers 510. The wet etchant can include phosphoric acid for etching second dielectric layers 512 including silicon nitride. In some embodiments, the etching rate and/or etching time are controlled to remove only the parts of second dielectric layers 512, leaving remainders 513 of second dielectric layers 512 intact. In some embodiments, the etching is controlled such that reminders of second dielectric layers 512 are above and overlap remainders 507 and 509 of sacrificial layer 506 and stop layer 505. As shown in FIG. 4, the wet etchant can be applied from the slit openings (the same locations as slit structures 330) to remove parts of second dielectric layers 512 within each memory block 402. By controlling the etching time, the wet etchant does not travel all the way to completely remove parts of second dielectric layers 512 between adjacent memory blocks 402, leaving remainders 513 of second dielectric layers 512 between adjacent memory blocks 402, e.g., at the location of stabilization structure 360.

Figure 5F:
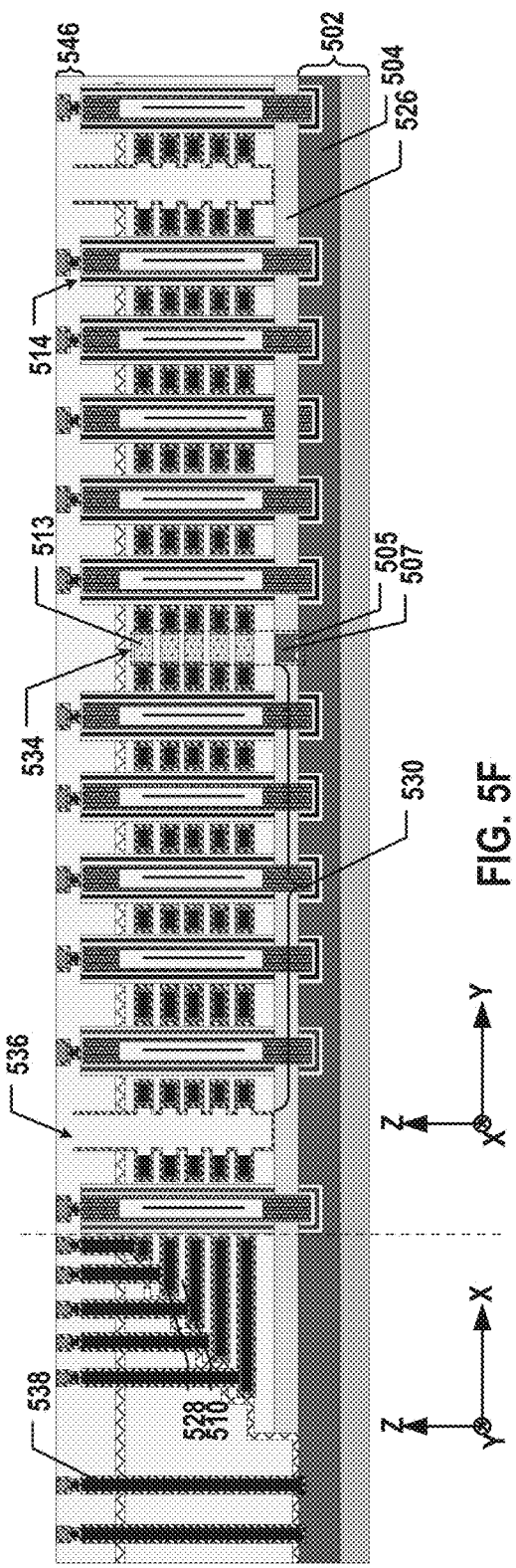
Figure 5G:
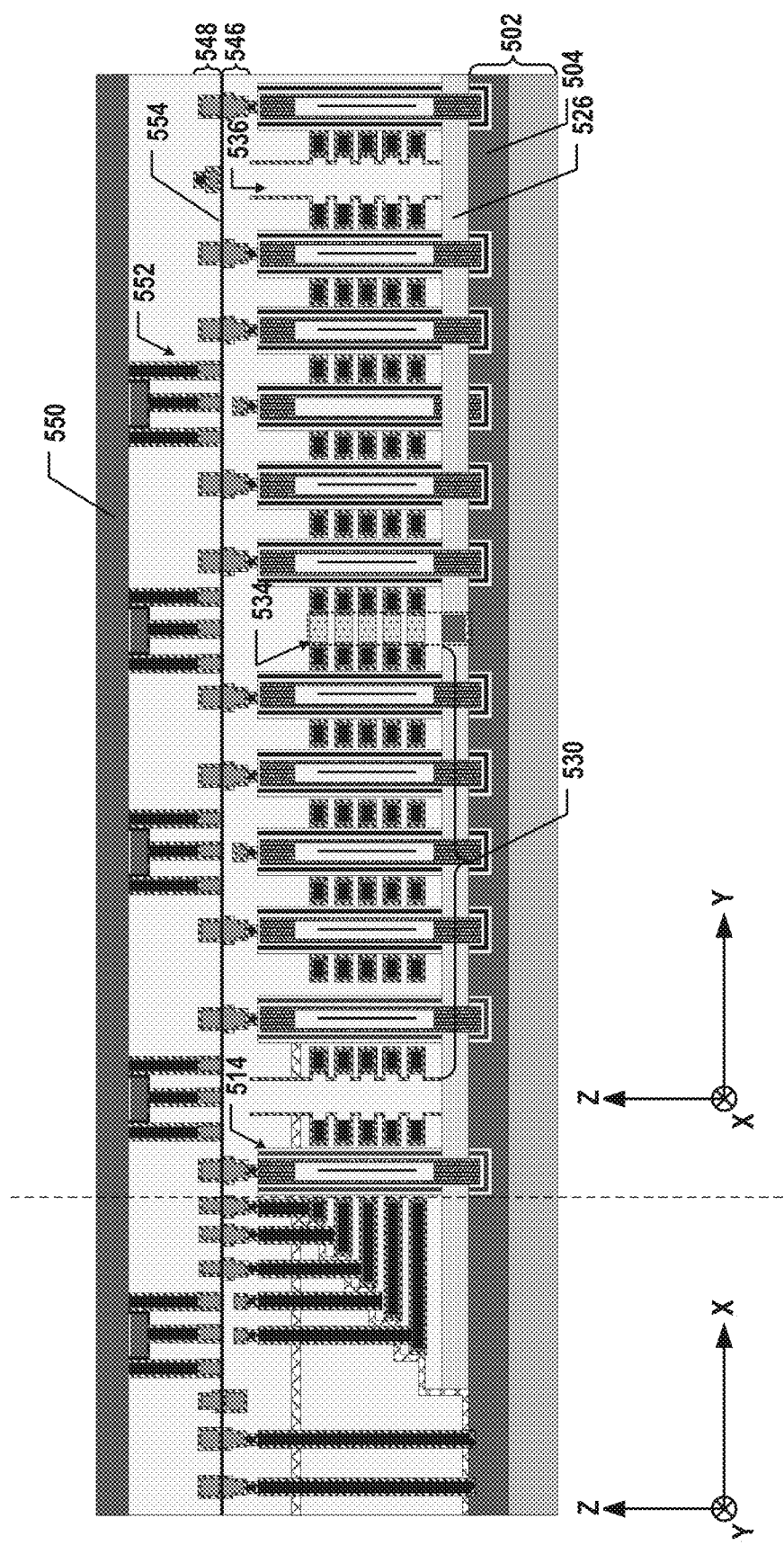

As illustrated in FIG. 5F, conductive layers 528 (including gate electrodes and adhesive layers) are deposited into lateral recesses 527 (shown in FIG. 5E) through slit opening 520. In some embodiments, a gate dielectric layer is deposited into lateral recesses 527 prior to conductive layers 528, such that conductive layers 528 are deposited on the gate dielectric layer. Conductive layers 528, such as metal layers, can be deposited using one or more thin film deposition processes, such as ALD, CVD, PVD, any other suitable processes, or any combination thereof. In some embodiments, conductive layers 528 fully fill lateral recesses 527 and thus, are in contact with remainders 513 of second dielectric layers 512, respectively, after depositing conductive layers 528.

As a result, part of dielectric stack 508 (shown in FIG. 5D) is thereby replaced with a memory stack 530 in each memory block (e.g., 402 in FIG. 4) including vertically interleaved conductive layers 528 and first dielectric layers 510, according to some embodiments. Channel structures 514 each extending vertically through memory stack 530 and semiconductor layer 526 into semiconductor layer 504 are thereby formed, according to some embodiments. A stabilization structure 534 including the remainder of dielectric stack 508 including vertically interleaved first dielectric layers 510 and remainders 513 of second dielectric layers 512 is thereby formed as well between adjacent memory blocks (e.g., 402 in FIG. 4), according to some embodiments. As shown in FIG. 5F, stabilization structure 534 can be formed between two slit openings 520 (shown in FIG. 5E) in the y-direction (e.g., the bit line direction). Stabilization structure 534 can further include remainders 507 and 509 of sacrificial layer 506 and stop layer 505 below and overlapping the remainder of dielectric stack 508. During the gate-replacement process for forming memory stack 530, stabilization structure 534 can provide support to stabilize and avoid collapse, thereby further increasing the production yield.

Method 600 proceeds to operation 616, as illustrated in FIG. 6, in which at least one slit structure is formed in the at least one opening. As illustrated in FIG. 5F, a slit structure 536 extending vertically through memory stack 530 is formed in slit opening 520 (shown in FIG. 5E), stopping on the top surface of semiconductor layer 526. Slit structure 536 can be formed by depositing dielectrics into slit opening 520 using one or more thin film deposition processes, such as ALD, CVD, PVD, any other suitable processes, or any combination thereof. It is understood that although not shown, in some examples, the slit structure may be formed by depositing dielectrics (as a spacer) and conductive materials (as a contact) into slit opening 520.

As illustrated in FIG. 5F, after the formation of slit structure 536, local contacts, including channel local contacts and word line local contacts, and peripheral contacts 538 are formed. A local dielectric layer can be formed on memory stack 530 by depositing dielectric materials, such as silicon oxide or silicon nitride, using one or more thin film deposition processes, such as CVD, PVD, ALD, or any combination thereof, on top of memory stack 530. As illustrated in FIG. 5F, a bonding layer 546 is formed above the local contacts and peripheral contacts 538. Bonding layer 546 includes bonding contacts electrically connected to the local contacts and peripheral contacts 538. To form bonding layer 546, an ILD layer is deposited using one or more thin film deposition processes, such as CVD, PVD, ALD, or any combination thereof, and the bonding contacts are formed through the ILD layer using wet etching and/or dry etching, e.g., RIE, followed by one or more thin film deposition processes, such as ALD, CVD, PVD, any other suitable processes, or any combination thereof.

Method 600 proceeds to operation 618, as illustrated in FIG. 6, in which the first substrate and the second substrate are bonded in a face-to-face manner As illustrated in FIG. 5G, silicon substrate 550 and components formed thereon (e.g., peripheral circuits 552) are flipped upside down. Bonding layer 548 facing down is bonded with bonding layer 546 facing up, i.e., in a face-to-face manner, thereby forming a bonding interface 554 between silicon substrates 502 and 550, according to some embodiments. In some embodiments, a treatment process, e.g., a plasma treatment, a wet treatment, and/or a thermal treatment, is applied to the bonding surfaces prior to the bonding. After the bonding, the bonding contacts in bonding layer 546 and the bonding contacts in bonding layer 548 are aligned and in contact with one another, such that channel structures 514 formed thereon can be electrically connected to peripheral circuits 552 and are above peripheral circuits 552. It is understood that although not shown, in some examples, silicon substrate 502 and components formed thereon (e.g., channel structures 514) may be flipped upside down, such that channel structures 514 are above peripheral circuits 552 after bonding.

It is further understood that various fabrication processes, such as substrate thinning, ILD layer deposition, conductive layer deposition, contact hole etching, and contact deposition, may be performed on one or both of the top and bottom surfaces of the bonded structure (e.g., silicon substrates 502 and 550) to form BEOL interconnects in various configurations, for example, as shown in FIGS. 3A-3D described above in detail.

According to one aspect of the present disclosure, a 3D memory device includes a plurality of memory blocks in a plan view and at least one stabilization structure extending laterally to separate adjacent ones of the memory blocks in the plan view. Each of the memory blocks includes a memory stack including vertically interleaved conductive layers and first dielectric layers, and a plurality of channel structures each extending vertically through the memory stack. The stabilization structure includes a dielectric stack including vertically interleaved second dielectric layers and the first dielectric layers.

In some embodiments, the plurality of memory blocks are arranged in a first lateral direction, and the at least one stabilization structure extends in a second lateral direction perpendicular to the first lateral direction in the plan view.

In some embodiments, each of the first dielectric layers extends laterally across the stabilization structure and the memory stacks.

In some embodiments, the first dielectric layers include silicon oxide, and the second dielectric layers include silicon nitride.

In some embodiments, the stabilization structure further includes a residual sacrificial layer and a residual stop layer. In some embodiments, the residual sacrificial layer includes polysilicon or silicon nitride, and the residual stop layer includes silicon oxide.

In some embodiments, each of the memory blocks further includes a semiconductor layer through which each of the channel structures further extends vertically. The semiconductor layer is coplanar with the residual sacrificial layer and residual stop layer, according to some embodiments.

In some embodiments, each of the memory blocks further includes at least one slit structure having an "H" cut, the slit structure extending vertically through the memory stack and extending laterally to form a plurality memory fingers in the respective memory block in the plan view.

According to another aspect of the present disclosure, a 3D memory device includes a plurality of memory blocks arranged in a first lateral direction in a plan view, and at least one stabilization structure each between adjacent ones of the memory blocks in the first lateral direction. Each of the memory blocks includes a plurality of memory fingers arranged in the first lateral direction and at least one slit having an "H" cut structure each between adjacent ones of the memory fingers in the first lateral direction. Each of the memory fingers includes an array of channel structures. The stabilization structure includes a dielectric stack including vertically interleaved first dielectric layers and second dielectric layers.

In some embodiments, the at least one stabilization structure extends in a second lateral direction perpendicular to the first lateral direction in the plan view.

In some embodiments, the first dielectric layers include silicon oxide, and the second dielectric layers include silicon nitride. In some embodiments, the residual sacrificial layer includes polysilicon or silicon nitride, and the residual stop layer includes silicon oxide.

In some embodiments, each of the memory blocks further includes a semiconductor layer coplanar with the residual sacrificial layer and residual stop layer.

In some embodiments, each of the memory blocks further includes a memory stack including vertically interleaved conductive layers and the first dielectric layers. Each of the channel structures extends vertically through the memory stack, according to some embodiments.

In some embodiments, each of the first dielectric layers extends laterally across the stabilization structure and the memory stacks.

According to still another aspect of the present disclosure, a method for forming a 3D memory device is disclosed. A dielectric stack including vertically interleaved first dielectric layers and second dielectric layers is formed above a substrate. A plurality of channel structures each extending vertically through the dielectric stack are formed. At least one opening extending vertically through the dielectric stack is formed. Part of the dielectric stack is replaced, through the at least one opening, with a memory stack by replacing parts of the second dielectric layers with conductive layers to form a stabilization structure comprising a remainder of the dielectric stack.

In some embodiments, to replace the part of the dielectric stack with the memory stack, the parts of the second dielectric layers are etched through the at least one opening to form recesses, leaving remainders of the second dielectric layers intact, and the conductive layers are deposited through the at least one opening into the recesses.

In some embodiments, the conductive layers are in contact with the remainders of the second dielectric layers, respectively, after depositing the conductive layers.

In some embodiments, the stabilization structure is formed laterally between two openings of the at least one opening.

In some embodiments, prior to forming the dielectric stack, a stop layer on the substrate, and a sacrificial layer on the stop layer are sequentially formed, such that the stop layer and the sacrificial layer are vertically between the substrate and the dielectric stack, and each of the channel structures extends vertically further through the sacrificial layer.

In some embodiments, part of the sacrificial layer is exposed from the at least one opening.

In some embodiments, prior to replacing the part of the dielectric stack with the memory stack, parts of the sacrificial layer and the stop layer are replaced, through the at least one opening, with a semiconductor layer, such that the remainder of the dielectric stack is above and overlaps remainders of the sacrificial layer and the stop layer in the stabilization structure.

In some embodiments, to replace the parts of the sacrificial layer and the stop layer with the semiconductor layer, the part of the sacrificial layer and the part of the stop layer are sequentially etched, through the at least one opening, to form a cavity, leaving the remainders of the sacrificial layer and the stop layer intact, and the semiconductor layer is deposited through the at least one opening into the cavity.

In some embodiments, the sacrificial layer includes polysilicon or silicon nitride, the stop layer includes silicon oxide, and the semiconductor layer includes polysilicon.

In some embodiments, the first dielectric layers include silicon oxide, and the second dielectric layers include silicon nitride.

In some embodiments, the at least one opening includes at least one slit extending laterally.

In some embodiments, after replacing the part of the dielectric stack with the memory stack, at least one slit structure is formed in the at least one opening.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
 a plurality of memory blocks arranged in a bit line direction in a plan view, wherein each of the memory blocks comprises:
  a memory stack comprising vertically interleaved conductive layers and first dielectric layers on a semiconductor stack including a first semiconductor layer and a second semiconductor layer; and
  a plurality of channel structures each extending vertically through the memory stack and the first semiconductor layer into the second semiconductor layer; and
 at least one stabilization structure extending laterally in a word line direction to separate adjacent ones of the memory blocks in the plan view, wherein the stabilization structure comprises a dielectric stack comprising vertically interleaved second dielectric layers and the first dielectric layers, and a residual stop layer coplanar with the first semiconductor layer and in contact with the second semiconductor layer.

2. The 3D memory device of claim 1, wherein the bit line direction is perpendicular to the word line direction in the plan view.

3. The 3D memory device of claim 1, wherein each of the first dielectric layers extends laterally across the stabilization structure and the memory stacks.

4. The 3D memory device of claim 1, wherein the first dielectric layers comprise silicon oxide, and the second dielectric layers comprise silicon nitride.

5. The 3D memory device of claim 1, wherein the stabilization structure further comprises a residual sacrificial layer coplanar with the first semiconductor layer.

6. The 3D memory device of claim 5, wherein the residual sacrificial layer comprises polysilicon or silicon nitride, and the residual stop layer comprises silicon oxide.

7. The 3D memory device of claim 1, wherein each of the memory blocks further comprises at least one slit structure having an "H" cut, the slit structure extending vertically through the memory stack and extending laterally to form a plurality memory fingers in the respective memory block in the plan view.

8. The 3D memory device of claim 1, further comprising a source contact in contact with the second semiconductor layer without in contact with the first semiconductor layer.

9. A three-dimensional (3D) memory device, comprising:
a plurality of memory blocks arranged in a bit line direction in a plan view, each of the memory blocks comprising a plurality of memory fingers arranged in the bit line direction and at least one slit structure having an "H" cut each between adjacent ones of the memory fingers in the bit line direction, each of the memory fingers comprising an array of channel structures;
a semiconductor stack including a first semiconductor layer and a second semiconductor layer, wherein the channel structures each extending vertically through the first semiconductor layer into the second semiconductor layer; and
at least one stabilization structure each extending laterally in a word line direction between adjacent ones of the memory blocks in the bit line direction, wherein the stabilization structure comprises a dielectric stack comprising vertically interleaved first dielectric layers and second dielectric layers, and a residual stop layer coplanar with the first semiconductor layer and in contact with the second semiconductor layer.

10. The 3D memory device of claim 9, wherein the word line direction is perpendicular to the bit line direction in the plan view.

11. The 3D memory device of claim 9, wherein the stabilization structure further comprises a residual sacrificial layer coplanar with the first semiconductor layer.

12. The 3D memory device of claim 9, further comprising a source contact in contact with the second semiconductor layer without in contact with the first semiconductor layer.

13. A method for forming a three-dimensional (3D) memory device, comprising:
forming a stop layer on a substrate;
forming a sacrificial layer on the stop layer;
forming a dielectric stack comprising vertically interleaved first dielectric layers and second dielectric layers on the sacrificial layer;
forming a plurality of channel structures each extending vertically through the dielectric stack and the sacrificial layer;
forming at least one opening extending laterally in a word line direction and vertically through the dielectric stack to expose the sacrificial layer;
replacing, through the at least one opening, part of the sacrificial layer and the stop layer with a semiconductor layer; and
replacing, through the at least one opening, part of the dielectric stack with a memory stack by replacing parts of the second dielectric layers with conductive layers to form a stabilization structure comprising:
a remainder of the stop layer in contact with the substrate,
a remainder of the sacrificial layer on the remainder of the stop layer, and
a remainder of the dielectric stack that extends laterally in the word line direction.

14. The method of claim 13, wherein replacing the part of the dielectric stack with the memory stack comprises:
etching, through the at least one opening, the parts of the second dielectric layers to form recesses, leaving remainders of the second dielectric layers intact; and
depositing, through the at least one opening, the conductive layers into the recesses.

15. The method of claim 13, wherein the stabilization structure is formed laterally between two openings of the at least one opening.

16. The method of claim 13, wherein replacing the parts of the sacrificial layer and the stop layer with the semiconductor layer comprises:
sequentially etching, through the at least one opening, the part of the sacrificial layer and the part of the stop layer to form a cavity, leaving the remainders of the sacrificial layer and the stop layer intact; and
depositing, through the at least one opening, the semiconductor layer into the cavity.

17. The method of claim 13, wherein the sacrificial layer comprises polysilicon or silicon nitride, the stop layer comprises silicon oxide, and the semiconductor layer comprises polysilicon.

18. The method of claim 13, wherein
the at least one opening comprises at least one slit extending laterally; and
the method further comprises, after replacing the part of the dielectric stack with the memory stack, forming at least one slit structure in the at least one opening.

19. The method of claim 13, further comprising forming a source contact in contact with the substrate without in contact with the semiconductor layer.

20. The method of claim 13, further comprising filling the at least one opening with a dielectric material.

* * * * *